US006987927B1

(12) United States Patent
Battaglia et al.

(10) Patent No.: US 6,987,927 B1
(45) **Date of Patent: *Jan. 17, 2006**

(54) ENHANCED DIGITAL DATA COLLECTOR FOR REMOVABLE MEMORY MODULES

(75) Inventors: Michael S. Battaglia, Naples, FL (US); Offie L Drennan, Naples, FL (US); Addison M. Fischer, Naples, FL (US)

(73) Assignee: SmartDisk Corporation, Naples, FL (US)

(*) Notice: Subject to any disclaimer, the term of this patent is extended or adjusted under 35 U.S.C. 154(b) by 1000 days.

This patent is subject to a terminal disclaimer.

(21) Appl. No.: 09/615,838

(22) Filed: Jul. 13, 2000

Related U.S. Application Data

(63) Continuation-in-part of application No. 09/149,448, filed on Sep. 9, 1998, now Pat. No. 6,658,202.

(60) Provisional application No. 60/200,470, filed on Apr. 28, 2000.

(51) Int. Cl.
*H04N 5/225* (2006.01)

(52) U.S. Cl. ...................... 386/117; 386/124; 386/125; 358/909.1

(58) Field of Classification Search ................ 386/117, 386/124, 125, 46; 358/909.1; 348/231.99, 348/231.1, 231.2, 231.3, 231.8, 220.1; H04N 5/225
See application file for complete search history.

(56) References Cited

U.S. PATENT DOCUMENTS

| | | | |
|---|---|---|---|
| 4,837,628 A | 6/1989 | Sasaki | |
| 6,005,613 A | 12/1999 | Endsley et al. | |
| 6,020,982 A | 2/2000 | Yamauchi et al. | |
| 6,256,063 B1 | 7/2001 | Saito et al. | |
| 6,658,202 B1 * | 12/2003 | Battaglia et al. ............ | 386/117 |

FOREIGN PATENT DOCUMENTS

| | | |
|---|---|---|
| EP | 786 715 | 7/1997 |
| EP | 1 043 844 | 10/2000 |
| JP | 9-149362 | 6/1997 |
| JP | 09-230496 | 9/1997 |

OTHER PUBLICATIONS

SmartDisk "User Guide for FlashTrax", SmartDisk Corporation, pp. 1-25, 2003, XP-002259871.
Toshiba, "Toshiba Unveils Mini-Notebook PC", Apr. 17, 1996, 5 pages.
IBM Palm Top PC 110 Technical Specifications, 2 pages.
IBM Palm Top PC 110, Sep. 25, 1995, Press Release, 3 pages.
IBM Palm Top PC 110, Jun. 18, 1996, 6 pages.
IBM Personaware, Palm Top PC 110, Jun. 18, 1996, 6 pages.
Picture of IBM Palm Top, 1 page.

(Continued)

*Primary Examiner*—Vincent Boccio
(74) *Attorney, Agent, or Firm*—Nixon & Vanderhye P.C.

(57) ABSTRACT

A hand-held battery powered data transfer and repository device for transferring data between one or more flash memory modules and a large capacity digital storage device, which may be either external or internal to the device. The device includes one or more slots to accept a flash memory module into a housing which includes processing and logic circuitry disposed within the housing for transferring data between the flash memory module and the large capacity digital storage device. Ports are disclosed for transferring data between the repository and data transfer device to a host device, which may be a wide range of digital appliances including a digital computer, a digital camera, a camcorder or a personal digital assistant.

39 Claims, 15 Drawing Sheets

OTHER PUBLICATIONS

Itoh, http://www.geocities.com/Tokyo/3270/photo-6.html, 2 pages, Feb. 1996.

Schuster, http://www.geocities.com/SiliconValley/Peaks/1559/pc110__n.htm, Nov. 1997, 10 pages (1 page, 6 pages, 3 pages of photos).

Waldron, http://apj.co.uk/pc110/pt__main.htm, 1995, 46 pages (2 pages., 4, pages., 13 pages, 4 pages, 4 pages, 10 pages, 3 pages, 6 pages).

Schuster, http://www.geocities.com/SiliconValley/Peaks/1559/pc110faq.htm, Jun. 27, 1998, pp. 1-29.

* cited by examiner

ENHANCED DIGITAL DATA COLLECTOR FOR REMOVABLE MEMORY MODULES

This application is a continuation-in-part of related U.S. application Ser. No. 09/149,448, Battaglia et al., which was filed on Sep. 9, 1998 now U.S. Pat. No. 6,658,202 and which is incorporated herein by reference. This application claims the benefit of U.S. Provisional Application No. 60/200,470, filed Apr. 28, 2000, the entire content of which is hereby incorporated by reference in this application.

FIELD OF THE INVENTION

This invention relates generally to data transfer and storage devices. More particularly, the invention relates to a hand-held, battery-powered, portable device for transferring data between, for example, a flash memory module used in conjunction with a digital camera or audio device and a mass storage device.

BACKGROUND AND SUMMARY OF THE INVENTION

Over recent years, digital cameras have been rapidly growing in worldwide popularity. Such cameras provide many advantages over the conventional film camera. For example, digital cameras do not require the time and financial expenditures of conventional cameras in terms of film development. Digital cameras are designed to be used in conjunction with a wide range of sophisticated computer graphics processing packages not available for conventional film cameras. Display devices associated with certain digital cameras advantageously provide the photographer with an enhanced ability to frame desired images and to review pictures just taken.

Digital cameras, however, are not without their disadvantages. Conventional high resolution digital cameras are currently very costly and employ expensive memory media which are capable of only capturing a relatively limited number of pictures. Such cameras may utilize a flash memory module having a storage capacity of, for example, 2 to 32 megabytes. These memory modules become increasingly more expensive as the storage capacity increases.

A high resolution digital camera with a conventional flash memory module may only have a storage capacity to permit a photographer to take a very limited number of pictures such as, for example, a half dozen or even fewer pictures. The vacationing photographer may choose to undertake a major expense to be assured of having enough memory modules to record memorable events from a two week vacation.

In accordance with an exemplary embodiment of the present invention, this digital camera shortcoming is overcome by a hand-held, battery-powered portable device for transferring data between a flash memory module and a mass storage device. The mass storage device may be able to store, for example, the contents of the equivalent of hundreds of flash memory modules.

In accordance with one exemplary embodiment of the present invention, the contents of a flash memory module inserted into an insertion memory port in the portable hand-held device is downloaded under operator control to a mass storage device in the form of a fixed or removable hard disk drive. Thereafter, the memory module is reinitialized so that it may be immediately reused in its associated camera.

The present invention also more broadly addresses problems related to the use of conventional flash memory modules in a wide range of devices. One of the problems often confronting users of portable digital memory, including for example flash memory cards such as the SmartMedia, MultiMediaCard or Memory Stick cards, is the ultimate movement of the data on them to a more permanent, a larger, a more accessible, or a more conventional storage medium. This is true, for example, as described above for consumers with digital cameras that store digital images on flash memory cards who desire to move the images to a large capacity hard disk, or other storage medium, to consolidate and "permanently" store the images, and to clear the memory card for reuse.

At present, the most typical means by which users satisfy this need is using their digital computer to copy the data from memory cards to disk or other storage accessible by the computer.

The illustrative embodiments of the present invention provide other means, often easier and more portable than a computer, to achieve this task. Various embodiments of the invention are designed to be particularly useful for users on vacation or "in the field" who may not have access to an operating computer.

As used herein in conjunction with some of the exemplary embodiments, the repository in its most general form shall often be termed the Large Capacity Digital Storage Unit (LCDSU). It is the medium to which various embodiments of the invention moves data, and is designed to encompass any form of mass digital storage device and associated media, including for example, without limitation:

- media in which the data is stored magnetically—including for example, tapes, floppy disks, and hard disks;
- media in which the data is stored optically—such as CDs, Magnetic Optical (Mos) and DVDs;
- media in which the data is stored electrically or electronically—such as various solid state memory devices;
- media in which the data is stored using any other aspect of the electromagnetic spectrum, including fluorescence, or other type of energy enabled storage and retrieval;
- media in which data is stored using quantum mechanical aspects of the storage medium;
- media in which data is stored using biological principles;
- media in which the data is stored by mechanically altering the media;
- media permanently attached to the read/write apparatus (such as a hard disk);
- media "removable" from the read/write apparatus, such as floppy disks, tapes, CDs, DVDs and ZIP disks
- media in which digital information is stored any other way.

The above-described features and other advantages of the present invention will become apparent from the following detailed description of the present invention when taken in conjunction with the accompanying drawings.

DETAILED DESCRIPTION OF EXEMPLARY EMBODIMENTS

Figure 1:
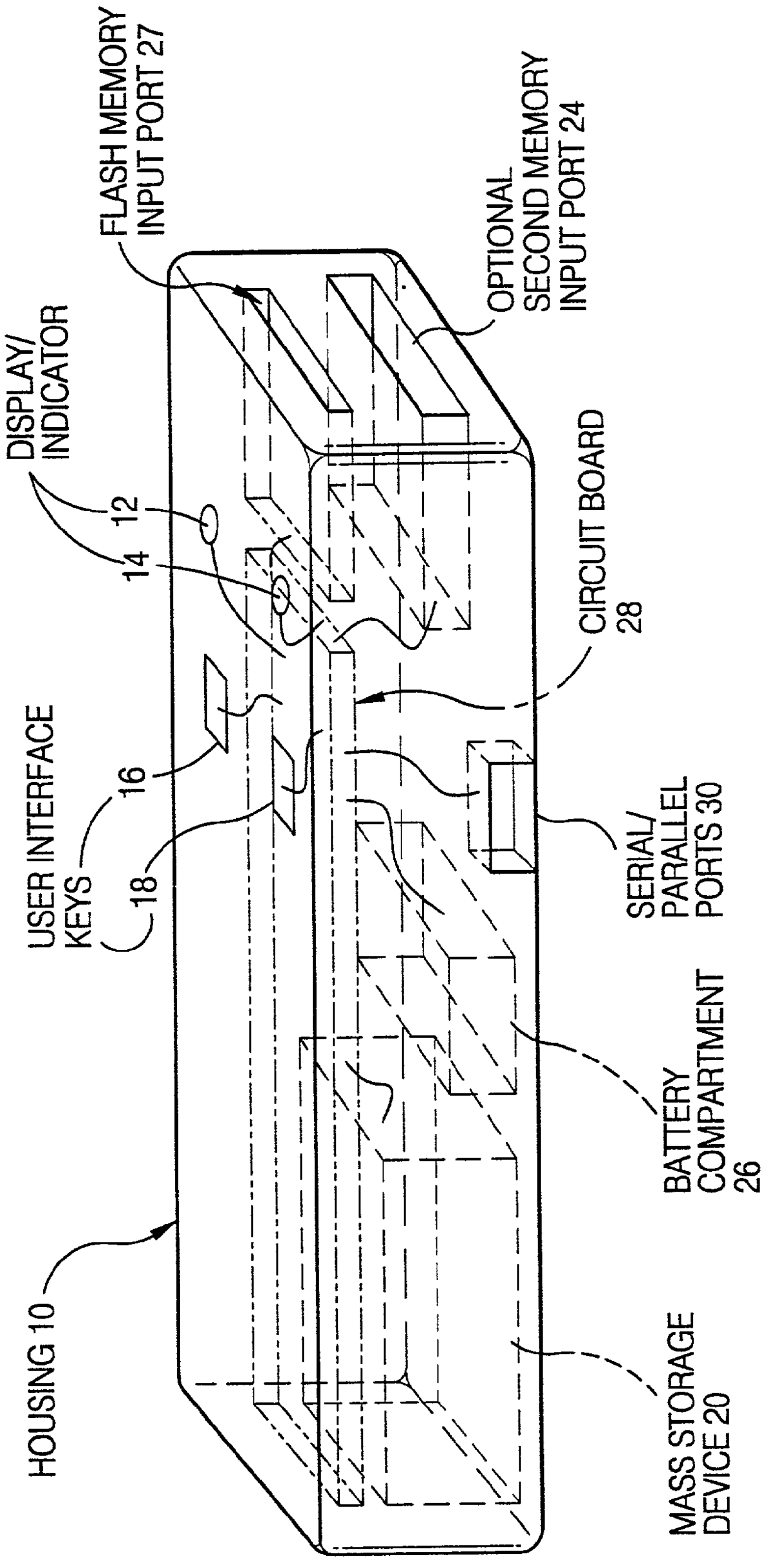
FIG. 1 is a perspective illustration of an exemplary embodiment of the present invention showing a hand-held housing and an exemplary component layout.

FIG. 1 is a schematic, perspective illustration of one exemplary embodiment of the data transfer and storage device in accordance with the present invention. The battery-powered device for transferring data includes a housing 10, which preferably is of a size which can be comfortably held in a user's palm and which is lightweight and readily portable.

As shown in the right hand portion of FIG. 1, the data transfer device includes a flash memory port 22. In the exemplary embodiment, port 22 is utilized to receive and electrically couple a memory module removed from a digital camera (or other device) to the mass storage device 20 under microprocessor control, as will be explained further in conjunction with FIGS. 2–5. In the presently preferred embodiment, flash memory input port 22 is designed to receive the commercially available Toshiba SmartMedia flash memory module standard. The SmartMedia memory standard is utilized in various digital cameras and may be directly interfaced with a PC's floppy disk drive, for example, via the commercially available FlashPath product. The SmartMedia module includes a flash memory chip, and processing circuitry in the form of a state control machine which controls reading and writing operations to an 8-bit bus. It should be understood that the present invention is not limited to any particular memory media, but may be utilized in conjunction with a variety of memory media where bulk data transfer is desirable. Although the memory module in the presently preferred embodiment contains image data captured from a digital camera, it should be understood that it alternatively may store any type of digital data including audio data used, for example, to reproduce music.

The data transfer and storage device of the presently preferred exemplary embodiment additionally includes an optional second memory input port 24, which is preferably designed to receive a storage media of a different standard than the memory media received in input port 22. By way of example only, the second memory input port 24 is designed to receive the CompactFlash or MMC media sold by SanDisk Corporation and/or the Sony Memory Stick. One or more of the memory media inserted into input ports 22 and 24 may include a microcontroller for performing more sophisticated processing operations as, for example, is done in the CompactFlash product.

Thus, the data transfer and storage device of the presently preferred embodiment is designed to accept more than a single standard flash memory card, and includes multiple slots (e.g., two or more) to support more than one standard. Because input ports 22 and 24 accept memory media of different standards, the media are coupled to mass storage device 20 via different interface and/or control logic circuitry as will be appreciated by those skilled in the art.

User interface keys 16, 18 are utilized by a user to initiate a download of information from the memory media to the mass storage device 20. At least one control key is provided for initiating the download operation. Another user interface key is used to format the memory module in accordance with its requirements for use in, for example, a digital camera for taking photographs. The memory module is formatted to initialize the memory module to place it in its initial default state where no data is stored. A "delete" control key/button may be utilized to, for example, initiate the erasure of data stored on the media. By way of example, the erasure operation may delete all the files on the media, or in more sophisticated embodiments delete certain directories or subdirectories.

In an alternative embodiment of the present invention, the user interface keys 16, 18 comprise a portion of a miniaturized keyboard, which may, for example, be utilized to select particular files and directories to copy to the mass storage device 20, which may (prior to downloading) be displayed on, for example, an LCD display (not shown). Graphical images may be displayed on the LCD display so that the user may preview a particular video image to decide whether it should be saved for long term storage. Such a capability advantageously provides the user with added selectivity and flexibility as to what image data is most desirable to maintain in mass storage device 20.

As opposed to using an LCD display, the user display may include, for example, LED display indicators 12 and 14. Display indicators 12 and 14 may display a wide range of status indications such as, for example, indicating that the flash memory copying operation is complete, and that the power is on. Additional display indicators may show the status of other operations such as, for example, a download operation being in progress.

Figure 2:
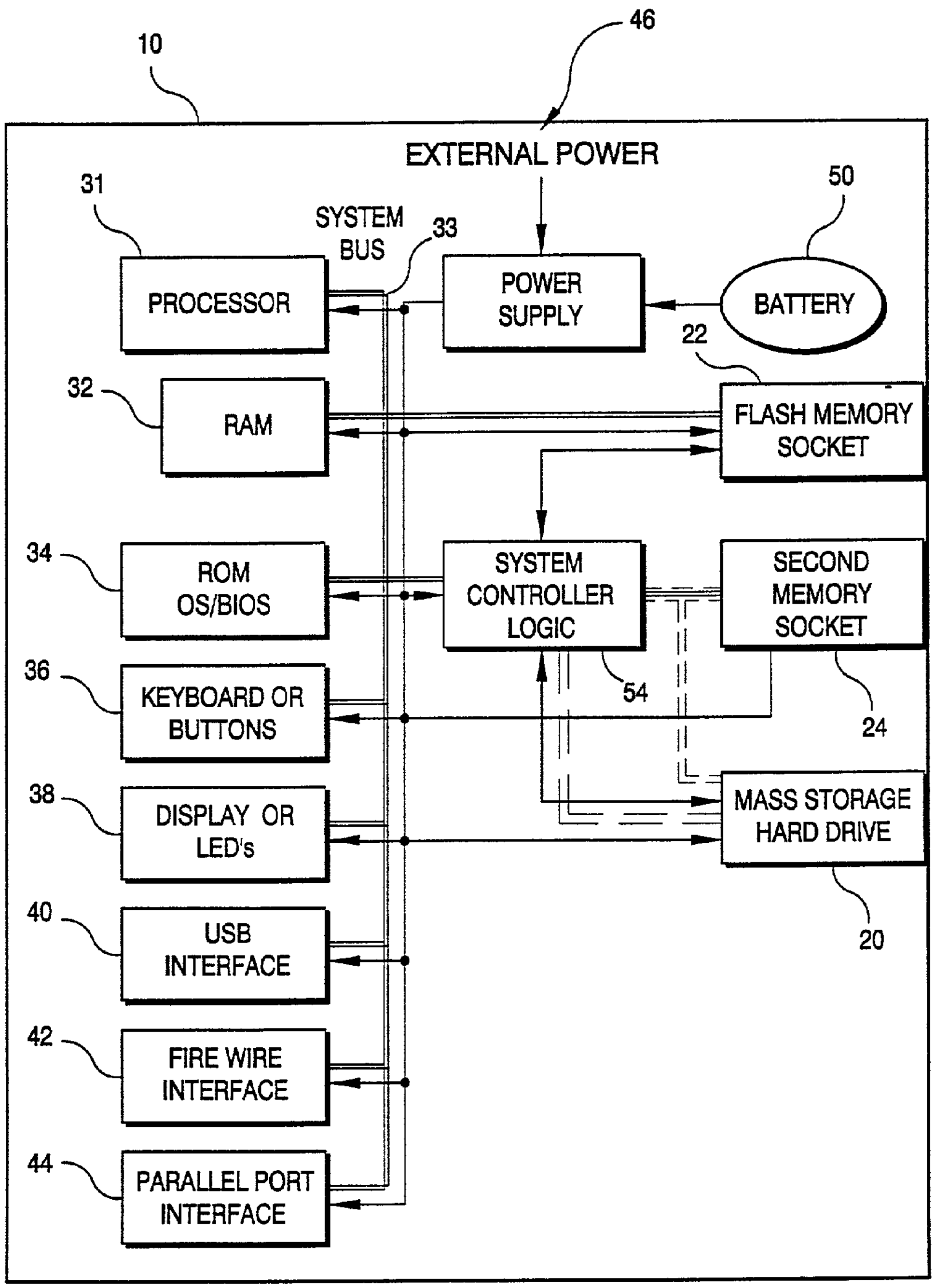
FIG. 2 is an exemplary block diagram of an exemplary implementation of the data transfer and storage system shown in FIG. 1.

FIG. 1 also depicts printed circuit board 28, which supports the electronic components schematically represented in FIG. 1 and which is shown in further detail in FIG. 2. These components are preferably powered by rechargeable batteries stored in battery compartment 26 and/or an AC adapter may be used.

Data is extracted from the FIG. 1 data transfer device through serial/parallel ports 30. Ports 30 are utilized, for example, after flash memory module data has been downloaded from multiple modules to mass storage device 20. The serial/parallel ports 30 permit downloading information from the FIG. 1 portable data repository to the user's personal computer at a convenient future time.

Ports 30 are intended to encompass a wide range of I/O ports including, for example, a Universal Serial Bus (USB), a parallel port, and a high speed serial port, such as a Fire Wire port or any desired subset of these or other known ports. The ports 30 may be designed to receive modules plugged into sockets for operating one of the desired ports.

Mass storage device 20 is preferably a commercially available hard drive. By way of example, such a hard drive may be a 2.5 inch hard drive or other appropriately sized hard drive commercially available from various vendors. The mass storage device 20 preferably includes at least one gigabyte of storage. The mass storage device 20 may, in accordance with one embodiment of the present invention, be fixed internally, or in another embodiment, removable from housing 10. In accordance with yet another embodiment of the present invention, the mass storage device 20 may be a battery backed SRAM. By way of example only, another option for mass storage device 30 is a high capacity flash memory module.

FIG. 2 is a block diagram showing the electronic interconnection between components of an exemplary embodiment of the data transfer and storage device of the present invention. As also depicted in FIG. 1, FIG. 2 includes a flash memory socket 22 and a second memory socket 24 which may be, by way of example only, respectively configured to receive Toshiba's commercially available SmartMedia, SanDisk's Compact Flash or MMC media, or the Sony Memory Stick. The SmartMedia is, in the exemplary embodiment, directly connected to system bus 33. System controller logic 54 includes the logic circuitry for transferring data from, for example, the Smart Media and Compact Flash memory media onto the system bus 33 for transfer to mass storage device 20 as will be explained below in conjunction with the description of FIG. 3.

Figure 3:
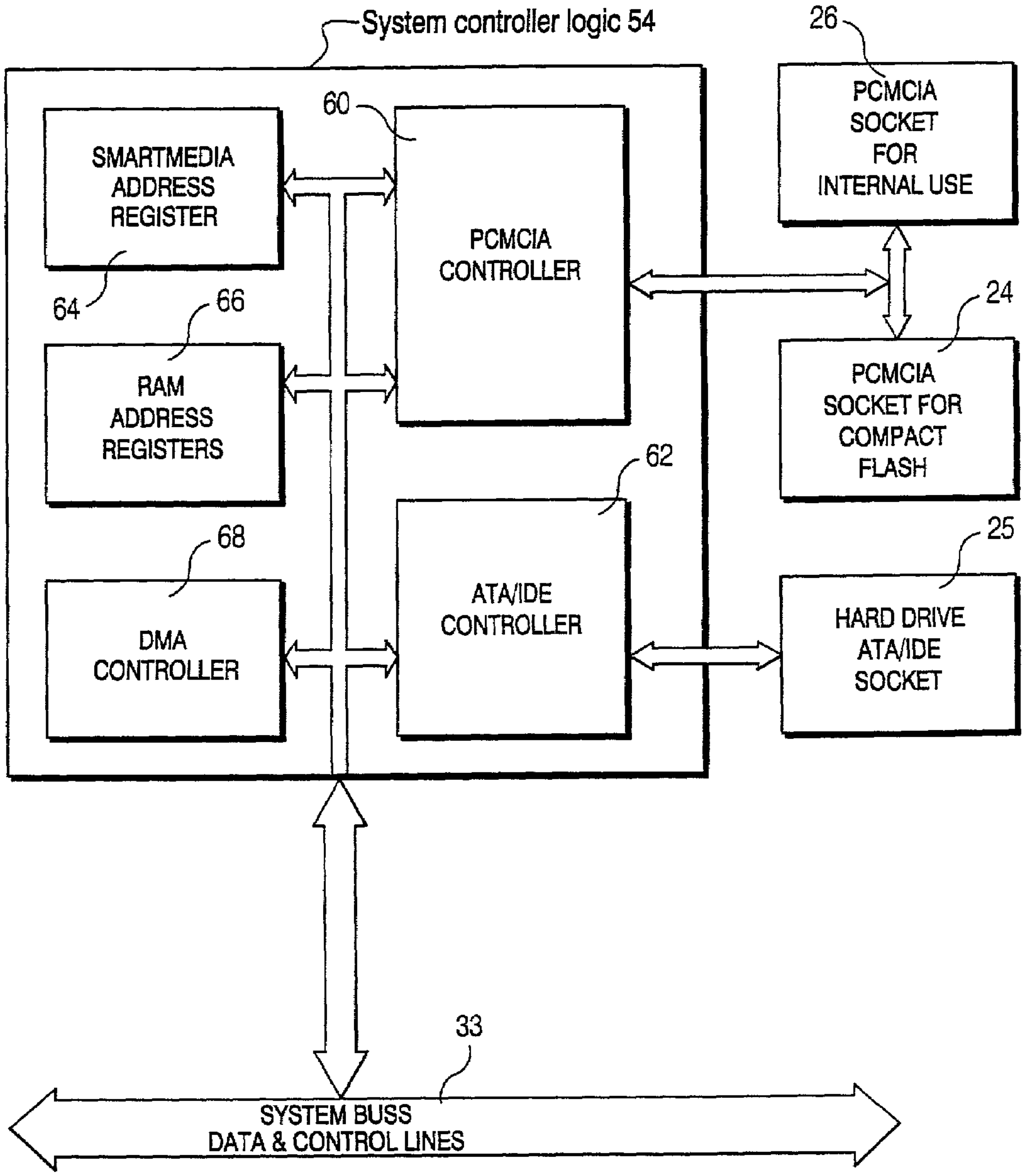
FIG. 3 is a block diagram depicting the system controller logic shown in FIG. 2.

FIG. 3 is an exemplary implementation of the FIG. 2 system controller logic 54 coupled to memory media receiving sockets 24, 25 and 26. In accordance with an exemplary embodiment, sockets 24 and 26 are conventional PCMCIA ports which are electrically and mechanically compatible with the memory media coupled thereto. Thus, the Compact Flash socket 24 is a PCMCIA socket which is electrically compatible with a Compact Flash media. If storage device 20 is implemented as a hard drive, a conventional hard drive ATA/IDE socket 25 is used to couple mass storage device 20 to the system controller logic 54. If mass storage device 20 is selected to be a removable hard drive, then a PCMCIA socket 26 may be utilized.

The system controller logic 54 manages the various memory devices to which it is connected under processor 31 control via system bus 33. The system controller logic 54 includes a SmartMedia address register 64 which is coupled to the flash memory/Smart Media socket 22 and which stores the Smart Media starting address to be accessed. Data may then be written to or read from the identified SmartMedia flash memory starting address. Similarly, RAM address registers 66 define desired starting addresses in RAM 32.

DMA controller 68 manages data flow between the various memory devices and may be implemented by a conventional DMA controller having a byte transfer counter and control registers. Through DMA controller 68, data may be moved from, for example, SmartMedia to RAM 32. Under such circumstances, processor 31 loads the appropriate addresses into Smart Media address register 64 and RAM address register 66. The byte transfer counter in DMA controller 68 is then loaded by processor 31 with the number of bytes to be transferred and a DMA controller 68 control register is loaded with information specifying the appropriate operation.

A conventional PCMCIA controller 60 may be utilized to control data exchange operations between the media in PCMCIA sockets 24 and 26 and devices coupled to system bus 33. Controller 60 includes an address decoder (not shown) that is coupled to the system bus 33. Controller 60 also includes configuration registers (not shown) which identify configuration information such as the number of memory media or other devices to which it is connected and the device which is currently communicating with processor 31. Controller 60 also includes a storage device for buffering data, and internal buses for interconnecting controller components. A conventional ATA/IDE controller 62 interfaces hard drive 20 with the system bus 33 and the devices connected thereto. As described above in conjunction with controller 60, ATA/IDE controller 62 includes an address decoder, configuration registers, a memory and internal bus for interfacing with hard drive 20.

Turning back to FIG. 2, data transfers are preferably initiated via a user keyboard, control keys, or buttons 36 under the control of processor 31. In one embodiment of the present invention, a miniature keyboard is utilized by a user to associate notes with an identified image, change the name of files, or to selectively create directories identifying where the user desires to move data.

As set forth in conjunction with the description of FIG. 1, the present invention contemplates a wide range of possible user graphic interfaces. For example, LED's may be utilized to indicate a downloading or other status condition. Alternatively (or additionally, if desired), an LCD display may be utilized for visually depicting, for example, a file name or subdirectory to permit the user to selectively delete undesirable pictures, which also may be displayed for the user to review.

Processor 31 may be any of a wide range of processors but preferably is a RISC-based, for example, 8 bit processor, such as the Atmel 8513. Processor 31, like each of the other components embodied in the data transfer and storage device, is selected to provide optimally low power consumption. Thus, while a variety of different processors may be selected, processor 31 is preferably a high speed processor having extremely low power consumption. The processor's operating system is resident in ROM 34.

The data transfer and storage device shown in FIG. 2 also includes RAM 32. RAM 32 stores operating system (and other processing) variables and buffers data being transferred between, for example, memory modules inserted into ports 22 and 24 and mass storage device 20.

The serial/parallel ports 30 represented in FIG. 1 are shown in FIG. 2 as USB interface 40, Fire Wire interface 42, and parallel port interface 44. These interfaces are utilized for transferring data from mass storage device 20 to, for example, a user's PC or notebook computer. For users having older computers which do not include a USB or Fire Wire interface, parallel port interface 44 may be utilized for downloading data to the user's computer. For newer computers, high speed data transfer may be accomplished via the USB or Fire Wire interfaces 40 or 42, respectively. The output interface ports shown in FIG. 2 are provided by way of example to indicate that a variety of interfaces are contemplated for interfacing with a wide range of user's computers.

The portable device shown in FIG. 2 typically operates under battery power such as, for example, by rechargeable AA batteries 50. Power supply 48, in addition to being powered by batteries 50, may also receive external power to permit a user upon arriving home to save battery power by using household power during uploading information to his or her computer. The external power source also permits batteries 50 to be recharged if rechargeable batteries are being used.

Mass storage 20 is preferably a hard drive as set forth in conjunction with FIG. 1. It is also contemplated that mass storage 20 may be a removable hard drive, a SRAM, or a large storage capacity, high density flash memory or other mass memory media which is commercially available today or becomes commercially available in the future. Mass storage device is coupled to control logic 54 via an ATA/IDE bus or a PCMCIA.

Figure 4:
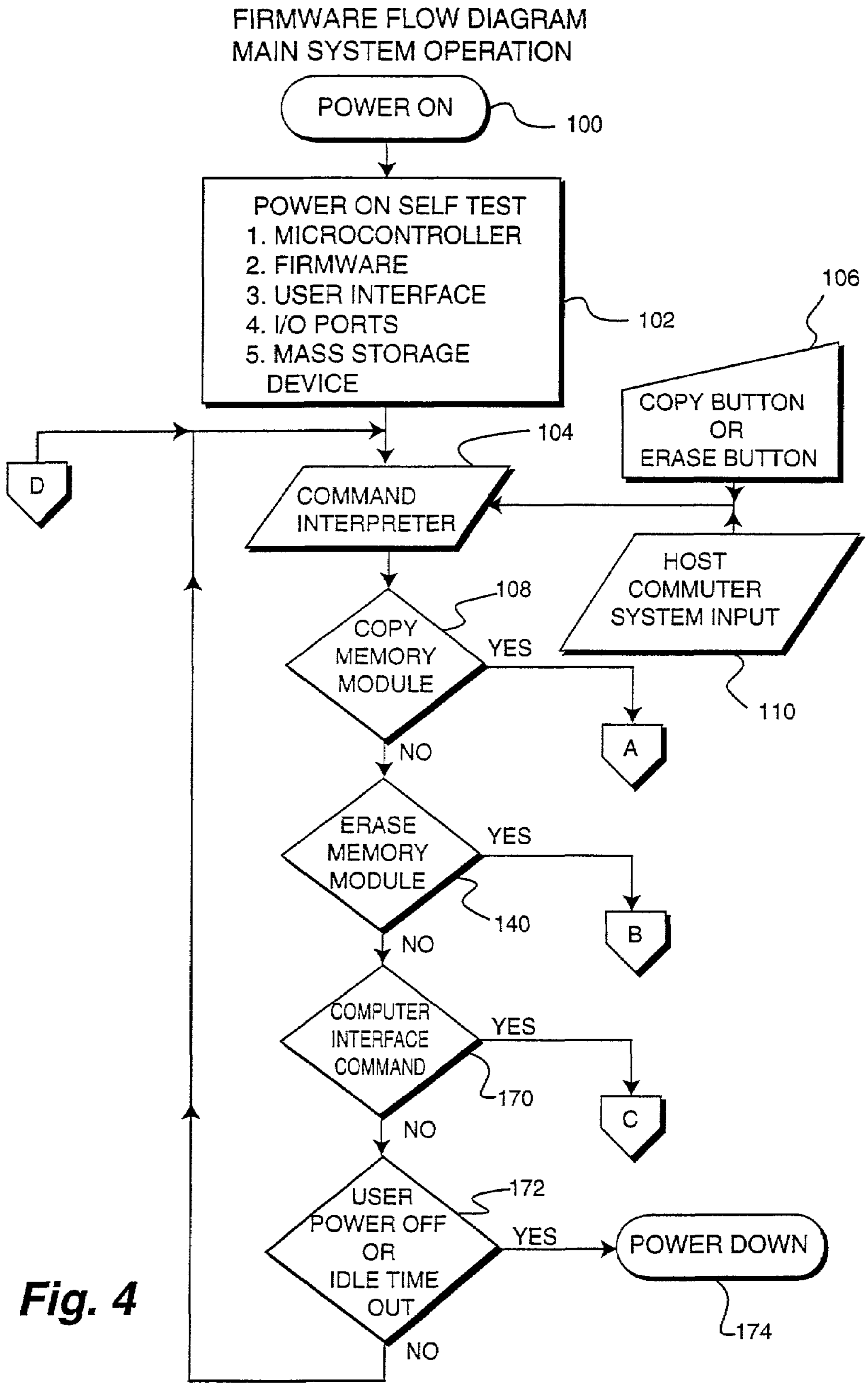
FIG. 4 is a flowchart of exemplary firmware depicting the portable storage device main system operation.

FIG. 4 is a firmware flowchart showing an exemplary set of processing operations that the present preferred embodiment sequences through. After power is turned on (100), processor 31 executes a power-on self test routine whereby the integrity of the device is initially confirmed. The device internal logic is exercised and checked to a limited extent before operating data transfer device. Initially, the integrity of processor 31 and its associated firmware is checked. Next, the user interface functions, the I/O ports, and the mass storage device are checked (102). The power-on self tests include executing diagnostic routines to ensure, for example, that RAM 32 is operational.

Thereafter, a command interpreter loop is entered (104). The system monitors all associated input/output devices for activity to determine the next operation to initiate (104). As represented schematically at block 106, an operation is initiated by a user, for example, actuating a copy or erase button. Alternatively, activity may be detected by processor 31 via the FIG. 2 USB, Fire Wire, or parallel ports 40, 42, and 44 (110). If activity is detected via the host computer system input, then processor 31 must interpret the host command.

At block 108 a check is made to determine whether the detected operational command is a copy memory module command. If so, "copy" operation processing is initiated, whereby data from a memory module is downloaded to mass storage 20 as set forth in the flowchart of FIG. 5A. Initially, the integrity of the data in the memory module is verified to determine that the memory media is a valid module (120). Thus, if the data stored in the memory module does not conform with the appropriate standard format, a "copy" operation will not be performed and an indication will be displayed to the user that the memory module is bad. Such an indication may be displayed, for example, via a status indicating LED or on an LCD display (122).

If the data integrity of the module is good, then subdirectories are created on the mass storage unit (124). Thus, in the process of making such data transfers, processor 31 creates appropriate subdirectories which, for example, may be sequentially numbered for each module that is inserted into, for example, socket 22. Each flash memory module may include its own subdirectory having all the contents of that module resident therein. The contents of the module is then copied into the created subdirectory. After the subdirectory has been created at block 126, the directory structure from the module is copied to the mass storage device (126). Thereafter, the files from the memory module are copied to the mass storage device 20 into the directory structure that had been created (128).

After the data has been copied, the integrity of the data that has been copied is verified to, for example, determine whether data has been loaded onto a defective portion of the hard drive, or whether there has been a power failure or a component failure (130). If the data cannot be verified, then an indication that the copying operation failed is conveyed to the user via a status LED or via an LCD display (132). If desired, an indication of the nature of the error may be displayed on an LCD display. If the integrity of the data is verified, then the user receives an indication that the copying operation has been successfully completed via a status LED or LCD (134) and the routine branches back to the command interpreter block 104 to await further activity.

If a copy memory module operation was not initiated then, as shown in FIG. 4, a check is made to determine whether an "erase memory" command has been initiated (140). If so, the routine branches to the flowchart shown in FIG. 5B, which delineates erase operation processing. Erase operation processing is utilized, for example, to prepare a flash memory module for reuse so that further pictures can be taken with the user's digital camera. Initially, a check is made to verify the data integrity of the memory module (150). This check ensures that the module has, for example, the proper data fields or supported density or supported voltage before any operation is performed thereon. If the memory module is determined to be bad, then the user receives a "bad memory media" indication, either via a status LED or via an LCD display (152).

If the module has been verified as being a valid module, then the desired files are deleted from the module (154). If the files cannot be deleted, then information is conveyed to the user that the erase operation has failed via a status LED or an LCD display (156). After the files have been deleted, memory media subdirectories are deleted (158). If the subdirectories cannot be deleted, then an indication is conveyed to the user that the erase operation failed via status LED or a LCD display (160). After subdirectories have been deleted, an indication is conveyed to the user that the erasure operation was successful via a status LED or LCD display (162) and the routine branches back to the FIG. 4 command interpreter.

If an "erase memory module" operation has not been initiated, then a check is made at block 170 to determine whether a computer interface command was initiated. If so, the routine branches to the FIG. 5C flowchart depicting computer interface command processing.

Computer interface processing typically occurs after the user, for example, has completed a photography session and has interconnected the portable data storage and transfer device to his or her PC. During such operations a user may download pictures stored in the mass storage device to the PC or alternatively, upload, for example, pictures stored in the PC to the portable storage device's mass media.

Figure 5A:
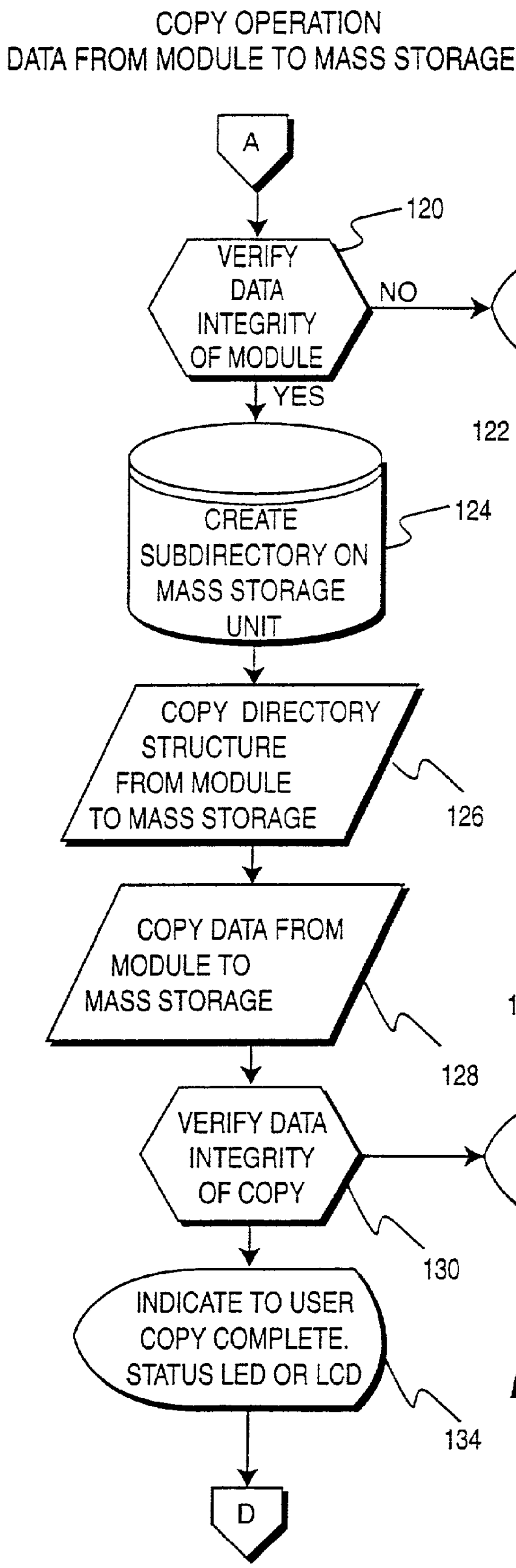
FIGS. 5A–5D are flowcharts delineating the sequence of processing for copy, erase, and computer interface command operations.
Figure 5D:
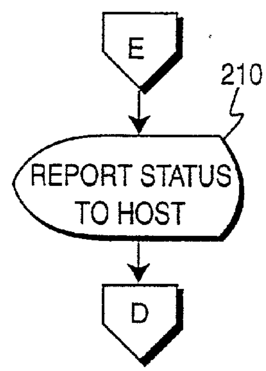
Figure 5B:
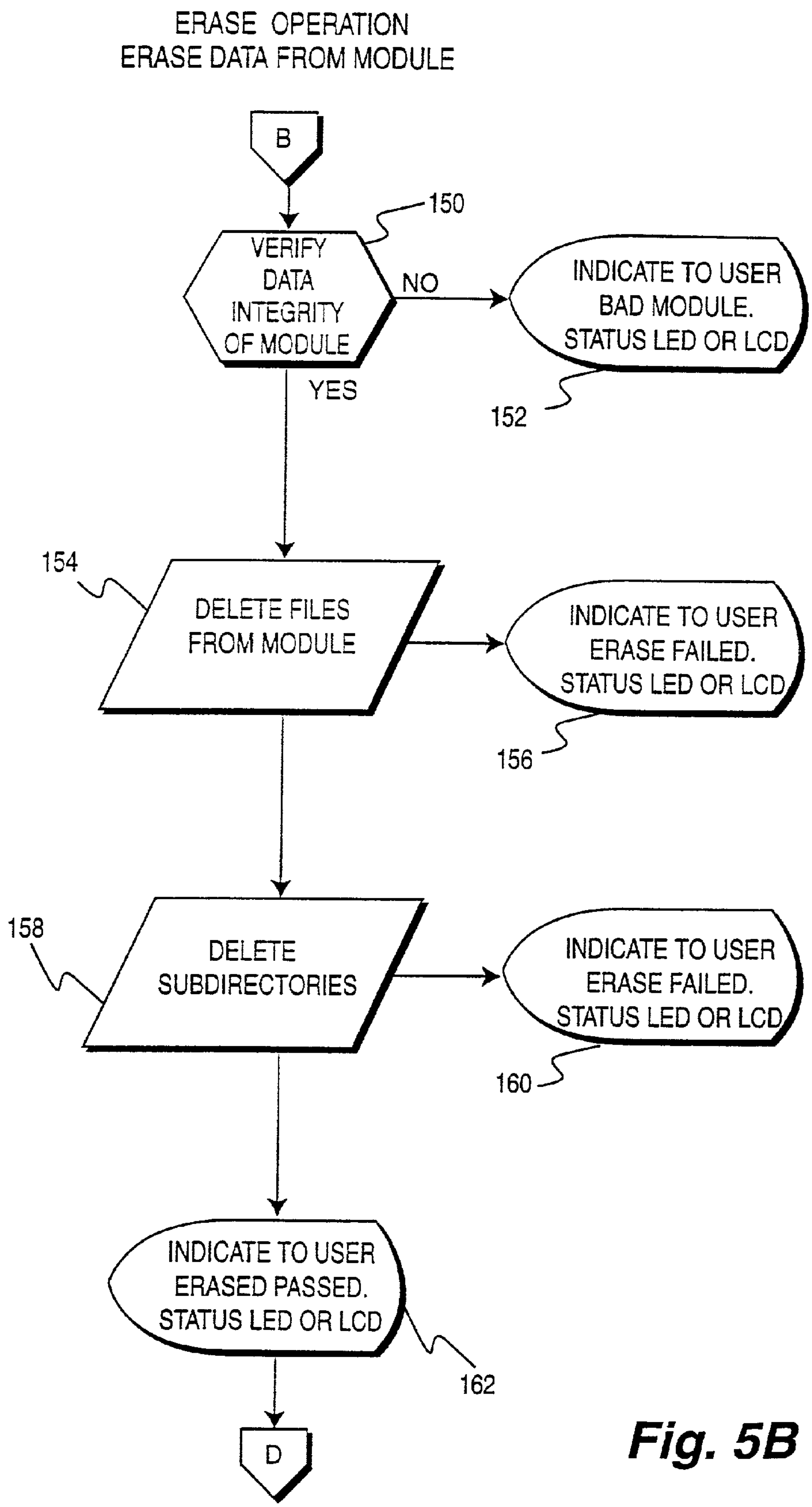
Figure 5C:
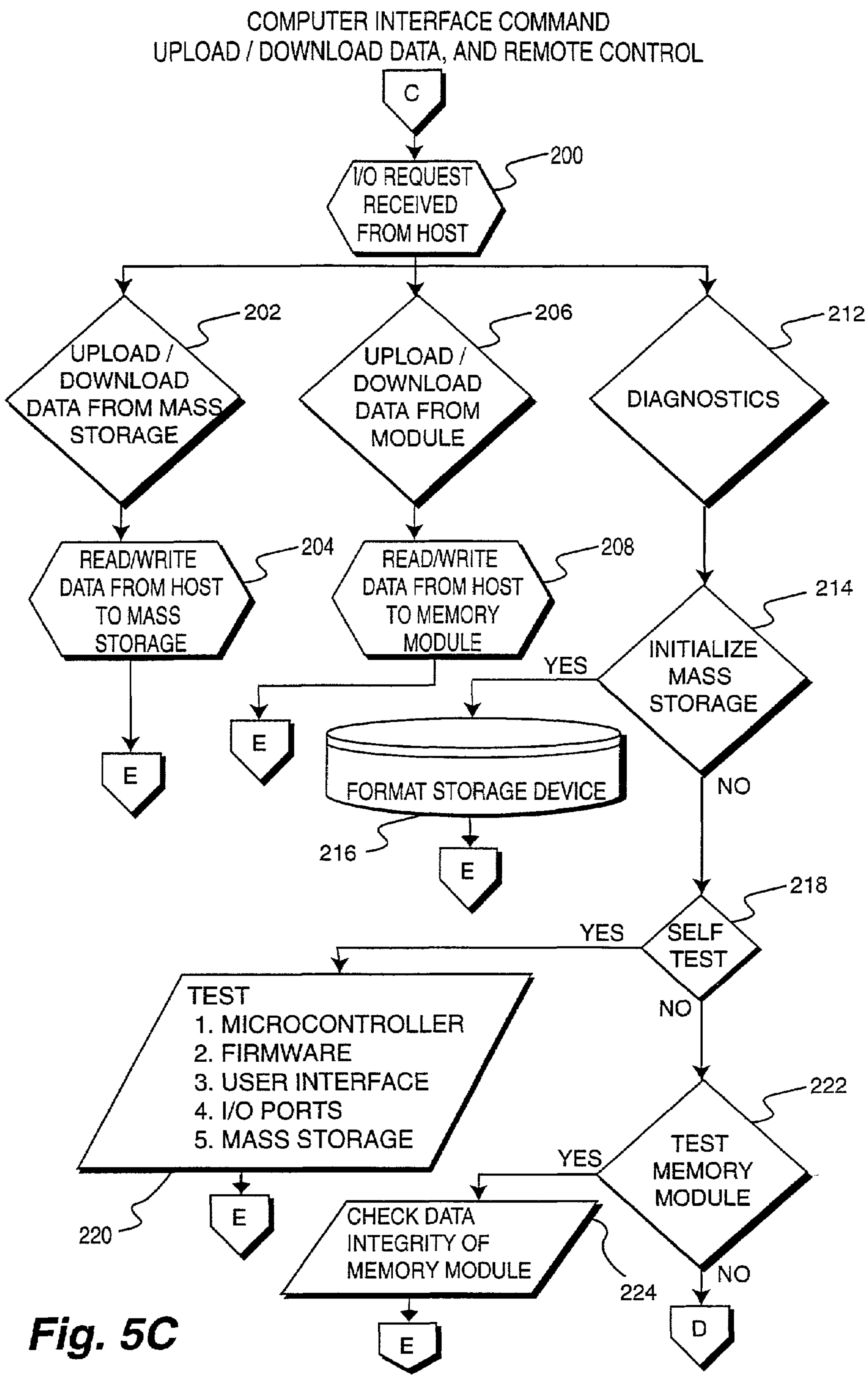

Initially, a check is made at block 200 to determine whether an I/O request has been received from a user's host PC and, if so, what kind of request has been initiated. As indicated at block 202, a check is made as to whether the requested activity is to upload or download data from or to mass storage device 20 to, for example, upload or download pictures (202). By uploading pictures from a user's PC, the portable data transfer and storage device thereafter may be utilized to hand-carry highly desirable pictures from one user's PC to another user's PC. Depending upon the desired direction of data transfer, data is either read from or written to the host or the mass storage device 20 (204). As indicated in FIG. 5D, a status report is then sent to the host and the routine branches back to FIG. 4 and its command interpreter block 104. During the data transfer process from or to the mass storage, the user would have the ability to delete files, rename files, and a wide range of other conventional file processing operations. Such host/mass storage data exchanges operate under the control of software resident in the user's PC.

As indicated at block 206, a check is also made to determine whether data exchanges are to take place between the memory module and the host computer (206). In this fashion, reading to or writing from the host to the memory module is controlled (208). Similar to exchanges between the host PC and mass storage, a wide range of data transfer operations may be controlled. After the host to memory module data exchange, a status report is sent to the host (210) and the routine branches back to the FIG. 4 command interpreter 104.

If the processing of block 200 reveals that an I/O request was received from the host, a check is also made to determine if the request was a diagnostics command (212). Such diagnostics may appropriately be initiated either during the device manufacturing phase or for user diagnostics. Initially, a check is made as to whether to initialize mass storage 20 (214). If the check at 214 indicates that mass storage is to be initialized to, for example, recover from a failure, the storage device 20 is reformatted (216), a status report is transmitted to the host (FIG. 5D at 210), and the routine branches back to the FIG. 4 command interpreter (104).

If the check at block 214 indicates that the mass storage 20 is not to be initialized, then a check is made to determine whether self test processing is be initiated (218). If self tests are to be initiated, then self test processing begins (220). The self tests performed at block 220 are more comprehensive than the power-on self tests previously referenced in that they output diagnostic information useful to service personnel for correcting a problem relating to processor 31 and its associated firmware, the user interface devices, the I/O ports and the mass storage device. Upon completion of these tests, the host processor is sent a status report (210) and the routine branches to the FIG. 4 command interpreter block 104.

If no self test command was received, a check is made to determine whether the memory media should be tested (222). If so, the integrity of data from the memory module is checked to respond for example, to a user complaint that the memory media can not be read. Service personnel can then determine that, for example, a particular data field has been corrupted requiring reformatting of the module. If no memory module testing has been initiated, the routine branches back to the command interpreter at block 104.

If no computer interface command has been initiated as determined at block 170, a check is made at 172 (FIG. 4) to determine if the user has depressed a power off key or alternatively has let the data transfer device sit idle for more than a predetermined idle time. If so, the device powers down (174). If not, the routine branches back to command interpreter block 104 to continue checking for command related activity.

The present invention may be utilized in a wide range of applications in addition to being used by amateur photographers. For example, the present invention may be used in conjunction with a team of professional photographers covering an event for a newspaper or magazine. Individual photographers having digital cameras may, for example, meet at a central location and transfer flash memory modules to a colleague having the present data transfer and storage device for storage of all the data. Such accumulated data may thereafter be downloaded to the newspaper's or magazine's central office computer.

Figure 6:
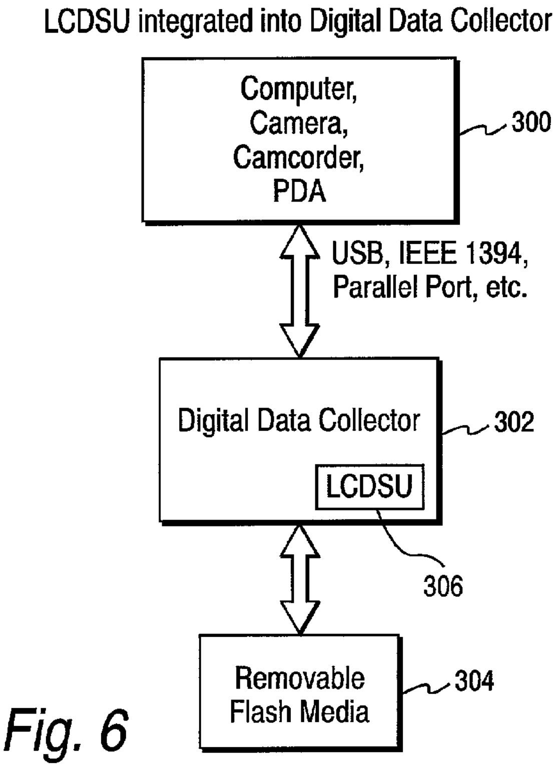
FIG. 6 is a block diagram of one exemplary embodiment of a system using a digital data collector with an integrated LCDSU.

FIG. 6 is a simplified block diagram depicting an enhanced digital data collector in accordance with a further exemplary implementation of the present invention. In accordance with this embodiment, a large capacity digital storage unit (LCDSU) 306 is integrated into the digital data collector 302. In accordance with the further exemplary embodiments described below, the enhanced digital data collector 302 or 310 (FIG. 7) with its LCDSU 306, 314 (FIG. 7) is connectable to a wide range of digital devices/appliances 300.

Figure 7:
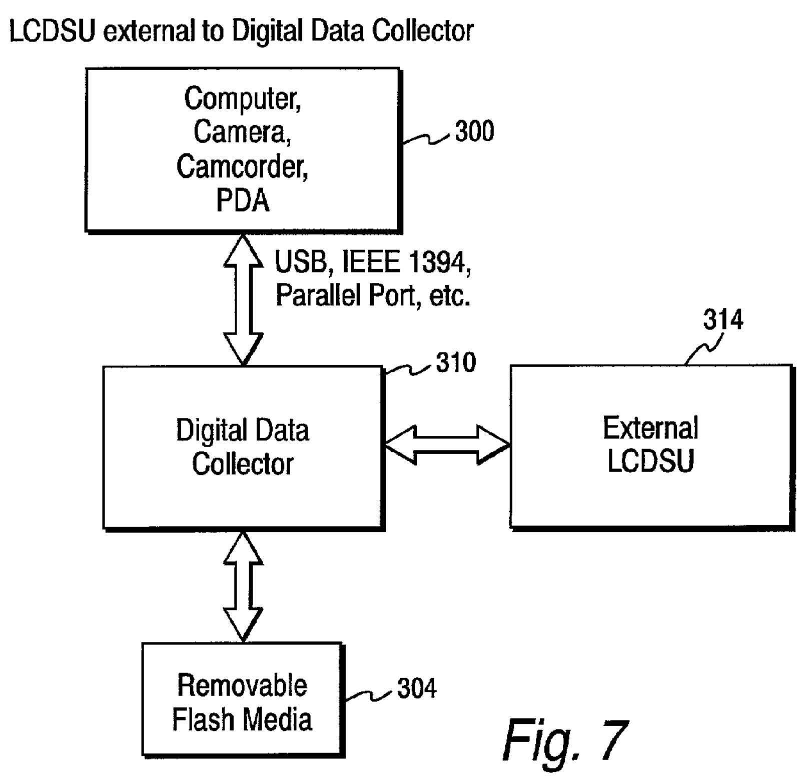
FIG. 7 is a block diagram of an exemplary embodiment of a system using a digital data collector with an external LCDSU.

FIG. 7 is a block diagram of a digital data collector 310, which communicates with host digital appliances 300 and removable flash media 304 in the same manner as described in conjunction with FIG. 6, but additionally communicates with an external large capacity digital storage unit 314. The digital data collector 310, in accordance with this alternative embodiment, is pluggably attachable to external LCDSU 314 to, for example, significantly reduce the cost of the data collector and give the user the flexibility of choosing his or her preferred LCDSU device to use in conjunction with the digital data collector 310.

By way of example only, as shown in FIG. 6, digital data collector 302 is connectable to a host device 300, which may be a computer, camera, camcorder, personal digital assistant (PDA), etc., via conventional ports such as USB, IEEE 1394 (FireWire™) parallel ports, etc. Virtually any available connection port connection is contemplated for use at the host 300 site in accordance with the exemplary embodiments of the present invention. For example, relatively high speed IEEE 1394 (FireWire™) or USB ports or relatively antiquated ports such as a parallel port may be used. As will be appreciated by those skilled in the art, the IEEE 1394 standard is a high speed interface standard which defines connectors, signal levels, data rates, etc. that are necessary for communications to take place in accordance with the standard. The IEEE 1394 standard is highly desirable in many applications due to its available extremely high speed data transfer rates, e.g., 400 megabits per second.

The digital data collector 302 (310) includes insertion ports for receiving one or more removable flash memory media 304. All or part of the flash media 304 contents may be transferred through the digital data collector to the large capacity digital storage unit (LCDSU 306 or 314). Alternatively, data stored in LCDSU 306 or 314 may be transferred to the removable flash media 304. Data, for example, from a camcorder may be streamed through digital data collector 302, 310 to LCDSU 306, 314. Many different combinations of data transfers are contemplated in accordance with the exemplary embodiments of present invention as reflected in FIGS. 6 and 7.

Digital data collector 302, 310 provides a user interface, which permits the movement of data from one device to another and provides interfaces between such devices in a manner not currently available. The data collector permits the user to uniquely manage such transfer of data in a highly flexible manner. Thus, a user on vacation desiring to use a removable flash memory module to take large numbers of pictures will be able to transfer such data to a high capacity store 306, 314 and reuse the relatively low capacity removable flash media 304—instead of having to purchase large numbers of relatively expensive flash media 304.

The FIG. 6 exemplary embodiment of the invention comprises a memory card reader and a large capacity digital storage unit (LCDSU), powered by replaceable batteries—all operated together and possibly, although not necessarily, enclosed within a single housing, depending on the details of the device embodiment. As described above, such an embodiment typically also provides a means by which it can be eventually connected to a computer or a network of computers so that data on the LCDSU may be transferred to or from at least one computer.

One implementation of this embodiment comprises dual readers for the SmartMedia and MultiMediaCards, coupled electronically to a hard disk, coupled to a FireWire (IEEE 1394) port, coupled to a battery power supply source, coupled to a digital processor, all combined in a single housing. The digital processor is coupled to all of these devices so that data may be read from the memory card and written to the disk, once this has been successfully done, the data is then erased from the memory card. Eventually the device is coupled to a computer or a network through the FireWire connection, so that the device appears to the computer or network as a disk device which can be processed using conventional means, including access of the data for retrieval, modification, augmentation, and erasure.

A simple version of this embodiment employs a switch embedded in the media reader(s) that turns on the processor whenever a card is inserted. This switch activates the processor to perform the default operations of: activating the disk by directing the proper power and signals to it; copying the media's data to disk; automatically erasing the media after the copy successfully completes; turning off the disk and the processor until another card is inserted or until a FireWire connection is activated. The processor is also activated when a FireWire connection is made. In this case the connection itself provides sufficient power to activate and sustain the processor. The processor presents itself to the computer as a disk or other storage device, allowing the contents of the hard disk to be accessed accordingly, including for example being read, erased or written by a computer system. When this embodiment uses connections other than FireWire which may not supply necessary power, the device may require: a sensor or coupling switch to determine when it is attached to a computer; or a user-operated "button" to activate power to the processor.

The FIG. 7 exemplary embodiment of the invention comprises a memory card reader and at least one means to connect to a detachable LCDSU. This embodiment is typically powered either by batteries, or by commercially available electrical power. One particular example of a detachable LCDSU is the portable hard disk from SmartDisk Corporation. This hard disk device has connections for, and supports, both FireWire (IEEE 1394) and Universal Serial Bus (USB) protocols and cables. Another example is a ZIP drive (connected for example through a parallel port), an LS-120 high capacity drive connected through USB, or a CD writer coupled through a SCSI connection.

In addition, an embodiment in this category could be implemented so that connection means allows connection to a computer or a network as well as a LCDSU, so that the device is able to function directly as a media reader for a computer or a network. Depending on the type of connection, the device could be designed to automatically distinguish whether it is connected to a computer or to a LCDSU. Otherwise, a switch or other user operated control could be implemented on the device to advise the device of the type of connection. Whether the device can do this automatically may depend on the type of connection (e.g., FireWire, USB, SCSI, parallel port, serial, etc.), and the signals presented by the computer's software and the LCDSU.

In one implementation of this embodiment, the device comprises: readers for both SmartMedia and MultiMedia cards (just as with the FIG. 6 embodiments, although only one type of media reader is necessary, readers for multiple types of memory media make it more useful to users), a FireWire connection, a battery power source, a digital processor, and optionally a clock.

In one simple form of an embodiment in this category, there are no user operated switches. To operate, the user first connects the device through its FireWire connection to a portable LCDSU (e.g., the SmartDisk portable hard disk unit), then the user inserts a media card, activating a switch within the media reader which starts the processor. The processor then activates the power controls within the device, and directs the necessary power and signals to the FireWire-connected disk to activate it. Once the disk has reached operating speed ready, the processor reads data from the media card and transcribes it as files on the disk. After the content of the media is successfully copied, the media is erased so that it is ready for re-use. Embodiments may choose to turn off the power to the disk at this time, or may leave it running for a period of time assuming the possibility that another media will be inserted shortly. However it is anticipated in most embodiments the processor will shut down the disk and turn off the power after a reasonable period of inactivity elapses.

FIG. 7 embodiments may have special considerations depending on the type of LCDSU expected to be attached. For example, the embodiment may wish to distinguish different formats of storage (e.g., disks formatted for various PC/DOS/Windows systems versus those formatted for Apple OS versus those formatted for Unix or Linux, etc.) depending on the type of anticipated LCDSU formats, the embodiment may be able to make such deductions without recourse to user advice. If an embodiment needs to support multiple types of LCDSU which cannot be inherently distinguished, the device might employ user-activated controls to guide its decision.

For embodiments described as being powered internally with "batteries", it should be understood that this refers to any element(s) capable of storing or generating power, which may take a variety of forms depending on the goals and uses of the embodiment: For example, and without limitation, this could include commercially available batteries of various voltages, such as AA, AAA, 9-volt, C cells, D cells etc. using alkaline, metal cadmium, metal hydride, lithium, or other well known ingredients and chemicals, which may or may not be rechargeable; as well as special purpose batteries, perhaps designed specifically for the embodiment; as well any other means of storing power or energy including fuel cells, capacitors, etc. In addition, although various embodiments are described as being powered by batteries, additional embodiments are envisaged which are powered externally, where such external power either supplants, augments, and/or recharges internal ("battery") power. Such external power may derive from normally available electrical current, possibly processed by a "power supply" to modify the voltage or other power characteristics. The power may also be generated by other sources such as by solar cells or other ambient energy (either to directly power the device, or to recharge the batteries), or by any appropriate combination of these means.

In addition to the memory cards available today, as exemplified by those already mentioned herein, the invention is not intended to be limited thereto. Embodiments are envisaged to support any other portable memory devices in addition to the flash memory devices (which merely happen to presently be economically feasible and common). Such additional memory devices include those using magnetic storage, optical storage including florescence, electronic storage, semi-conductor storage, storage based on quantum mechanical principles, storage based on mechanical alteration of the media, storage based on biological principles, silicon-based storage, and any other portable storage for which uploading to a massive repository is desirable. Although these portable memory devices are often herein referred to as "cards", that is intended to be exemplary and not restrictive—they can take any form which is conveniently portable.

For each embodiment category, as suggested above, the possibility of implementations are contemplated employing one or more of a variety of possible connections between an embodiment and the LCDSU, or between an embodiment and a computer or network system, including by way of example and without limitation: USB, FireWire, SCSI, serial port, parallel port, infra-red or other electromagnetic connections including for example radio linkage, and network protocols such as ethernet, token ring, 10/100 BaseT, etc., Actually any connection capable of communication digital data is sufficient, including those using: aspects or subsets of the electromagnetic spectrum (including radio, fiber optical and infra-red aspects of the spectrum); electrons; magnetism; quantum mechanical principles; cable contain metal; cable containing silicon. Some embodiments may be implemented allowing multiple types of connections.

Embodiments may also include clocks to maintain the date and time. This may be useful when writing files on the LCDSU to mark created files and directories with the correct time. Means of setting these clocks include for example: controls on the device by which the user can set the clock; means by which the time is transferred from computers or some other device; and means by which the time is received electronically by some other manner such as a broadcast source. In the case of FIG. 6 type devices, the device is naturally connected to computers from time to time, and downloading of operational parameters, including time and date, could occur through during such connection. With many FIG. 7 type embodiments, the connection (such as USB, FireWire, SCSI, etc.) used for the LCDSU can also serve to as a connection to a computer, and could similarly be used to download operational parameters including date and time.

Various enhancements to an embodiment are contemplated including switches that control aspects of device operation including at least one of: a power on switch, a power off, a switch to set the date and time for embodiments which supports date/time clocks, a switch controlling whether data on the media is to be erased or retained after copy; whether multiple copies of the media are to be made (e.g., for redundancy); whether an embodiment is to operate in the mode of moving data from media cards to the LCDSU versus as a device attached to a computer; how an embodiment is to appear to an attached computer (as a disk or some other class of LCDSU device; and if for example as a disk, what format of disk it must support (e.g., FAT16, FAT32, an Apple OS format, a UNIX format, etc.) or what type of connection is to be used if the embodiment supports a selection (e.g., USB, FireWire, serial port, SCSI, parallel port, etc.). Similar considerations apply to FIG. 7 type embodiments in determining the type of LCDSU to which they are attached, including the format, mode and type of connection of the LCDSU if various possibilities are deemed to exist. Embodiments may also allow a user to select various options used when moving data from portable media to the LCDSU—for example: whether a new sub-directory is to be created for each upload; what naming convention is to be used for created files and directories (e.g., should directories be created with sequential numbers versus date and time, etc.); what course of action should be taken if an error occurs when uploading data; whether the source data on the media is to be deleted after being copied; whether data should be encrypted or compressed as it is written, and the selection of possible associated parameters.

Also embodiments may implement display capabilities, such as small LCD or LED optical readouts used to indicate errors or successful operation; amount of data transferred; the time and date; the characteristics of the associated LCDSU (e.g., an indication of the storage used, or storage available); the status of operations being performed on the LCDSU; the status of the operations being performed by the computer; the state of various modes which may have detected or have been set by the user; etc. More sophisticated displays are also contemplated for displaying, for example, a video image, to a user who may elect, for example, whether or not, to save the image.

It is also contemplated that certain embodiments may have the capability of copying information from the LCDSU to the portable media (memory card). This allows the possibility of applications in which the LCDSU contains much vaster amounts of information than the portable media, and in which some relevant subset needs to be loaded onto a media card for use, say, with a hand-held appliance. For example, if the LCDSU was a comprehensive repository of maps, for which a hand-held appliance only needed and could accept a small amount loaded through a media card. In this case it may well be that applications of such embodiments might (although not necessarily) require simple controls to select which data from the LCDSU should be downloaded, as well as perhaps a simple LCD or LED display to guide the user through the selection.

Figure 8:
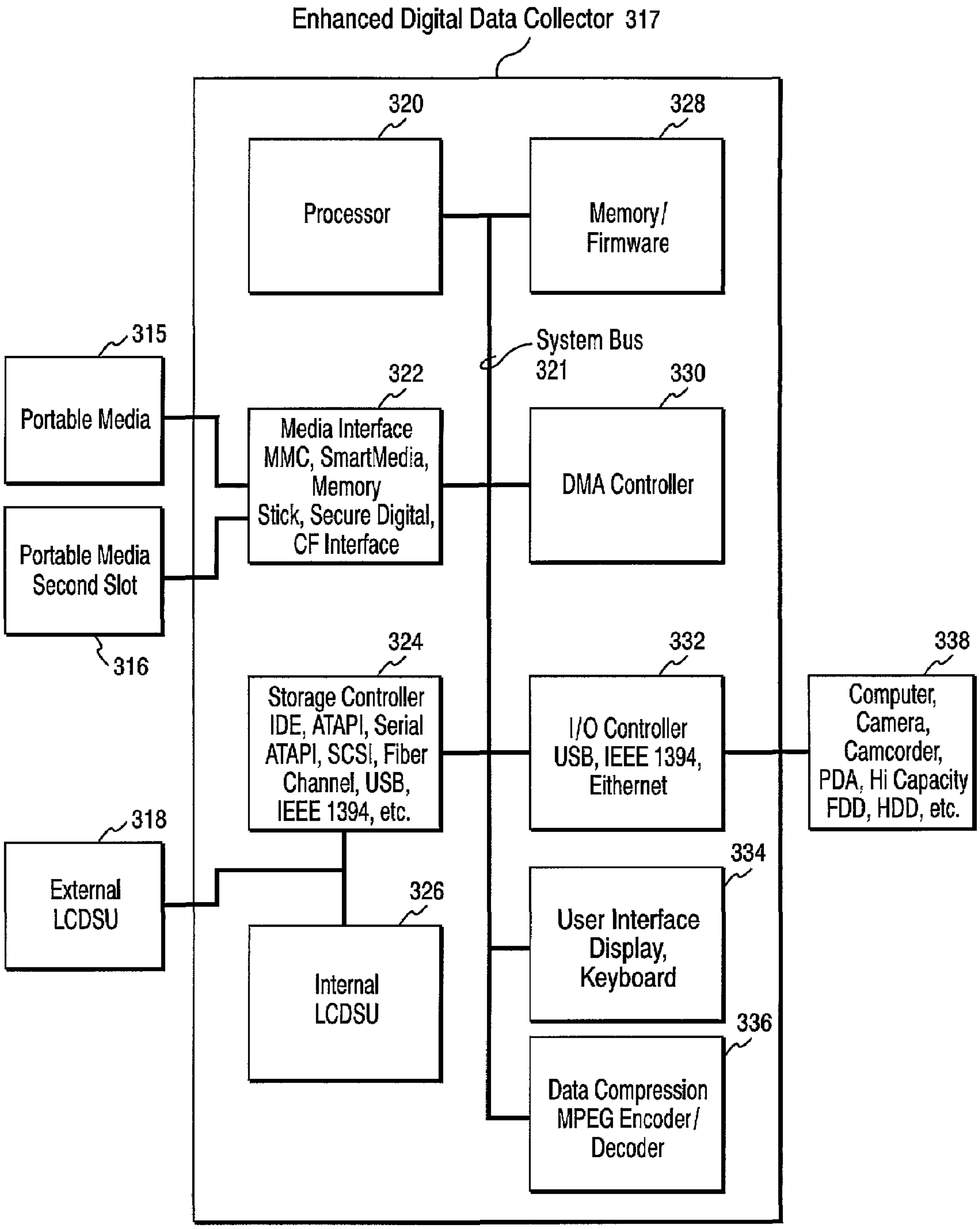
FIG. 8 is a block diagram of an exemplary embodiment of an enhanced digital data collector.

FIG. 8 is a block diagram showing a more detailed implementation of an enhanced digital data collector 317 in accordance with further exemplary embodiments of the present invention. As shown in FIG. 8, digital data collector 317 includes multiple portable media slots as exemplified by portable media 315 and 316, which are received by media interface 322. In accordance with one exemplary embodiment of the present invention, digital data collector 317 include ports for receiving a wide variety of media, such as, MultiMediaCard (MMC), SmartMedia, Memory Stick, Secure Digital, CompactFlash and other available media.

The enhanced digital data collector 317 is designed to permit data transfer between individual media 315, 316 and each of the components shown in FIG. 8. In accordance with an exemplary embodiment of the present invention, when a portable media is plugged into data collector 317, the media insertion is detected, which triggers power-on sequencing for the data collector 317 in a manner which will be explained below in conjunction with an explanation of FIG. 9. The data collector 317 components are powered by a power supply system, which is not shown in FIG. 8, but which is described below in FIG. 10.

Each portable media which is connectable to the data collector 317 has associated interface which is embodied in media interface 322. Media interface 322 includes the electronics necessary to interface each particular media to local system bus 321.

Processor 320, which may, by way of example only, be a RISC processor such as an Atmel AVR microcontroller, provides the major portion of the intelligence for digital data collector 317. Processor 320 manages (with the assistance of DMA controller 330) all of the above-identified data transfers referenced above and controls the interfacing to bus 321 of each perspective media. Processor 320 is coupled to memory 328 which is, for example, utilized to store program code/firmware executed by processor 320 in performing its digital data collector management and control tasks.

Digital data collector 317 also includes DMA controller 330 coupled to processor 320 via bus 321 to control the various data transfer operations to thereby lighten the processing burden on processor 320. DMA controller 330 may be constructed as described above in conjunction with DMA controller 68 in the first described embodiment.

The precise control exercised over data transfers depends upon the current host device 338 to which data collector 317 is connected. For example, if a portable media 315 is being coupled to a computer 338, the enhanced digital data collector 317 may operate in a "dumb reader" mode of operation. In this mode of operation, data may, for example, be transferred from a portable media 315 through media interface 322 under the control of DMA controller 330 to I/O controller 332 via, for example, a USB or IEEE 1394 port to a host computer. In this mode of operation, the enhanced digital data collector 317 operates as a, for example, USB (or IEEE 1394) portable media reader. I/O controller 332 includes ports for interconnecting a wide range of digital appliances including computers, cameras, camcorders, PDAs, high capacity floppy disk drives, and hard disk drives. Such ports include USB, IEEE 1394 and Ethernet ports. I/O controller 332 includes the interface logic for coupling such devices to local system bus 321.

Alternatively, data in, for example, portable media 316 may be coupled via media interface 322 under the control of DMA controller 330 to storage controller 324 and then to external LCDSU 318. External LCDSU 318 may be a high capacity floppy drive or a hard drive or any of the other wide range of mass storage devices described above. In accordance with a FIG. 6 implementation, such a data transfer may likewise be made under the same control between a portable media 315, 316 and an internal LCDSU 326 via storage controller 324.

Storage controller 324 includes conventional I/O ports such as IDE, ATAPI or Serial ATAPI, SCSI, fiber channels, USB, IEEE 1394 or other ports. Storage controller 324 may have one or more of the above-identified ports depending upon the desired flexibility to be built in to digital data collector 317. The LCDSU 318 and/or 326 are contemplated to encompass any of the forms of mass digital storage as described above in the Background and Summary of the Invention section of the invention.

The enhanced digital data collector 317 also includes a user interface 334 for permitting user control of the data collector 317. User interface 334 includes a display which may, for example, be implemented in the form of an LED display or an LCD display for displaying a wide range of status and control signals/messages. An LCD display also may, for example, be utilized to display video/graphical images (including, for example JPEG, TIFF, BMP, JIF, PCX, etc, or moving images like Digital Video, MPEG, AVI, etc) for the user to peruse in deciding whether to maintain or discard a particular image. If the user decides to save such an image, then the image would be transferred to, for example, hard drive 326 or 318 under user control. User interface 334 also may include a wide range of control keys including a compact, but complete keyboard to permit the user to perform a wide range of file editing operations.

In accordance with an illustrative implementation of the present invention, enhanced digital data collector 317 also includes data compression circuitry 336 which may include an MPEG encoder/decoder. Where host device 338 is, for example, a camcorder, video information may be coupled via, for example, a IEEE 1394 interface associated with I/O controller 332 and be streamed to data compression circuitry 336. Compressed video/audio data is then saved for storage in LCDSU 326 or 318. In accordance with contemplated implementations, if a detachable external LCDSU 318 were utilized, such compressed video from, for example, camcorder 338 may be coupled to hard drive 318 to fully load 318 after which the external LCDSU would be detached and a new drive 318 attached for further data storage.

Figure 9:
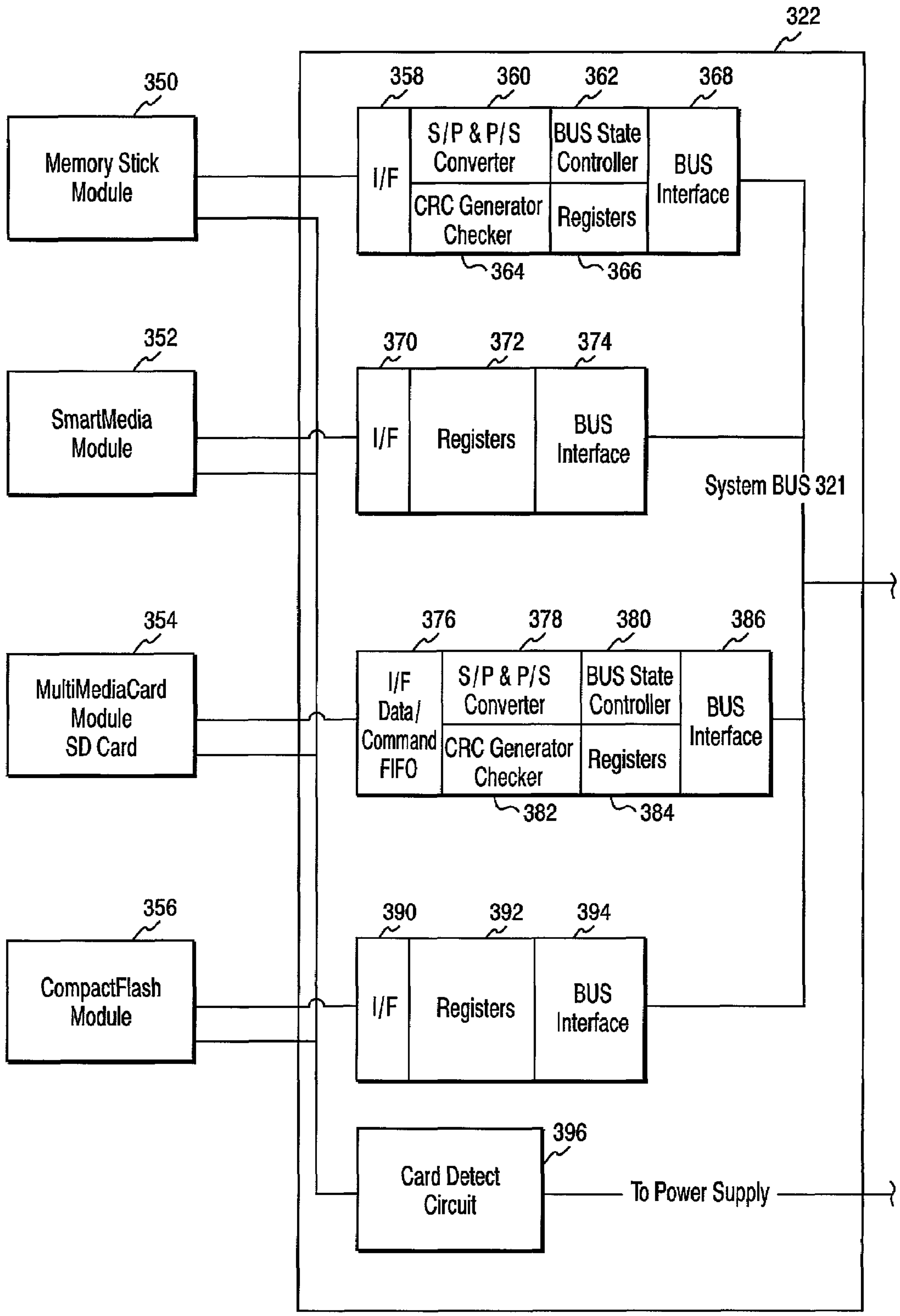
FIG. 9 is a block diagram of the media interface shown in FIG. 8.

FIG. 9 is a block diagram of the media interface 322 shown in FIG. 8 and depicts interface configurations for interfacing with particular available forms of memory modules that may be utilized in conjunction with the presently preferred embodiments.

As explained above in conjunction with FIG. 8, the exemplary embodiments contemplate interfacing with a wide range of memory modules limited only by the desired flexibility and cost of the enhanced digital data collector 317. In the FIG. 9 exemplary implementation, four memory modules are shown including Memory Stick module 350, SmartMedia module 352, MultiMediaCard or SD card 354 and CompactFlash module 356.

FIG. 9 includes a card detect circuit 396 which is operable to sense when any of modules 350, 352, 354, 356, etc., are plugged into the enhanced digital data collector 317 and to generate a signal, which is coupled to the data collector 317's power supply (described in conjunction with FIG. 10) to turn on power. In accordance with one exemplary implementation of the present invention, upon the detection of the insertion of a particular memory module 350, processor 320, upon being powered up and completing initialization operations, may operate to access a memory file in, for example, module 350, i.e., a script file which contains commands for controlling subsequent operations. In this fashion, a desired application may be automatically started in response to execution of such script file commands as a result of detecting module insertion and power up operations. After removal of the media the unit could automatically power down after a configurable idle period. Advantageously, the insertion of the portable media could be detected causing the device to power up and run an automated sequence which would, for example, copy the media contents to the LCDSU without user interaction and then power down. A status indicator could be used to show the operator when the operation was complete.

Memory Stick module 350 has a synchronous, serial interface. Module 322 includes an interface 358 for physically coupling Memory Stick module 350 via an appropriate memory insertion socket and interface logic to enhanced digital data collector 317. A serial to parallel and parallel to serial converter controller 360 is coupled to interface logic 358 to convert the serial output from MemoryStick to parallel format for transmission over the 8 bit wide local bus 321 and to convert the 8 bit, 16 bit, or 32 bit wide local bus 321 into a serial data stream. A CRC generator/checker 364 appends/checks a CRC value to data transmitted/received to/from MemoryStick module 350 so that error checking may be performed on a received/transmitted serial data stream. A bus state controller 362 is utilized to control the serial to parallel, parallel to serial conversion unit 360 and the appending of a CRC code to the data stream in unit 364. Bus state controller 362 also controls the clocking of data out via bus interface 368 to system bus 321 and controls receiving data from bus 321 for writing to memory module 350. Bus state controller 362 is controlled via processor 320 or DMA controller 330 through a set of registers 366. Registers 366 are programmed by processor 320 to define the functions that are to be performed, such as, for example, read data, write data, error conditions, or status. The register contents are read by bus state controller 362 to control the defined operation. Bus state controller 362 also loads a module status to registers 366 to, for example, enable processor 320 to monitor such status. Bus interface 368 interfaces between the processor 320, system bus 321 and the bus state controller 362.

SmartMedia module 352 includes a parallel byte-wide interface which is physically coupled via an appropriate insertion port socket to interface logic 370. No serial to parallel or parallel to serial conversion or CRC checking is required. Data to be transferred to SmartMedia module 352 is received from system bus 321 and latched into bus interface 374. Registers 372 receive commands from processor 320 which define the operation performed by SmartMedia module 352. Data is transferred to SmartMedia through interface logic 370. Processor 320 or DMA controller 330 operates to load registers 372 to control the proper logic state of SmartMedia module control pins to effect, for example, desired read and write operations.

The MMC/SD card module 354 includes an interface which generally corresponds to Memory Stick module 350 interface. The MMC/SD card related interface logic 376 includes channels for both data and commands. Interface 358 (associated with Memory Stick) includes a single I/O interface as opposed to the two I/O interface associated with MMC module 354. In interface 376, the channels are asynchronous to each other to permit sending commands to the memory module 354 while at the same time receiving data from the module. Interface 376 includes a data/command first in, first out stack operating as a buffer. The interface for MMC module 354 includes serial to parallel and parallel to serial conversion circuitry 378 (Data bus maybe 1,2,3, or 4 bits for SD Card) and a CRC generator/checker 382 which are similar to the above-described units 360 and 364 associated with the MemoryStick module. Likewise, bus state controller 380 performs the above-described functions of bus state controller 362 and in addition manages the data/command FIFO processing to permit dual channel operation. Registers 384 and 386 operationally correspond to their above-described counterparts 366 and 368 associated with module 350.

CompactFlash module 356 has a parallel interface which conform to the ATAPI standard, and includes a 16 bit wide bus. Module 322 includes a bus interface 394 which interfaces with system bus 321 and is coupled to registers 392 which are loaded with read, write and other commands under processor or DMA control to thereby control communication with module 356 via 16 bit wide interface logic 390.

Figure 10:
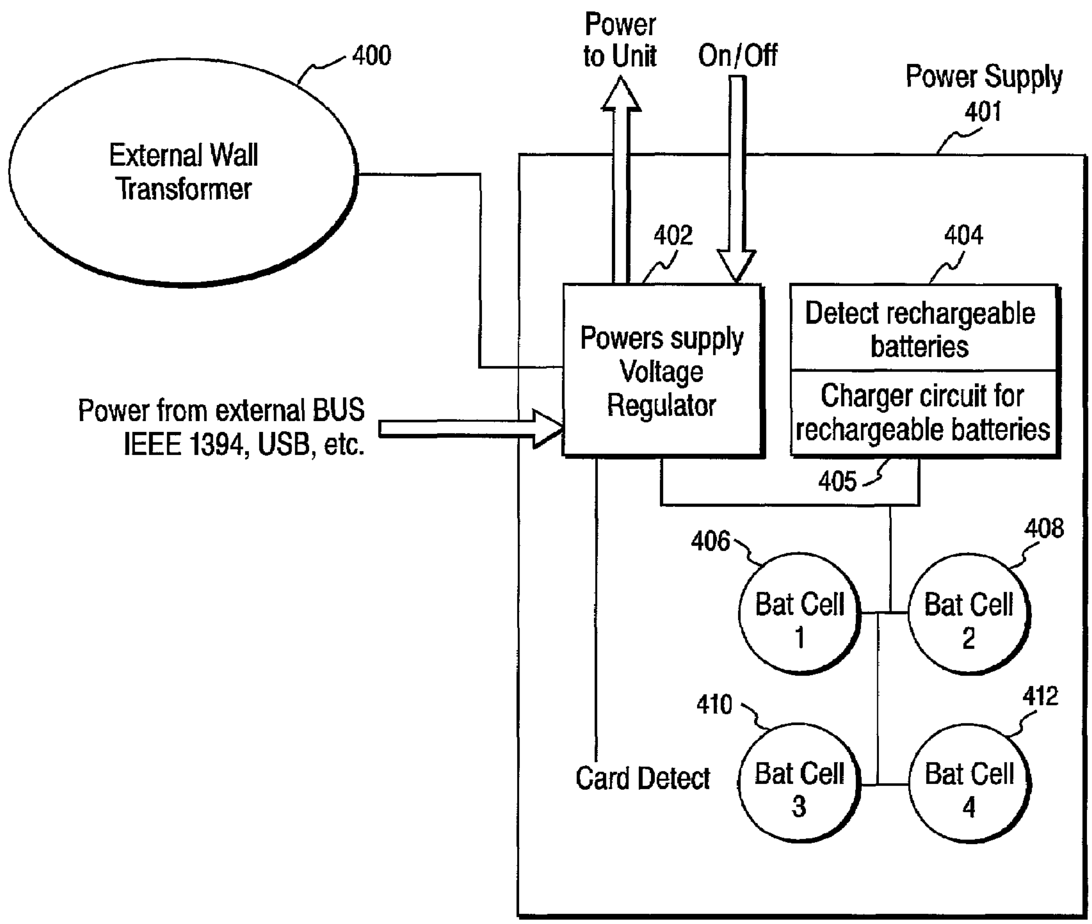
FIG. 10 is a block diagram of the power supply used to power the FIG. 8 components.

FIG. 10 is a block diagram which depicts the power supply 401 embodied within the FIG. 8 exemplary embodiment of the present invention. Power supply 401 includes battery cells 406, 408, 410 and 412, which may be implemented with rechargeable cells or alkaline cells. A detect circuit 404 detects the presence of rechargeable batteries. The detect rechargeable battery circuit 404 in the exemplary embodiment of the present invention preferably stores a record of recharging history of the batteries together with an indication of the type of battery pack present. Upon detection of rechargeable batteries, charger circuitry 405 monitors and recharges the rechargeable batteries detected.

Power supply 401 includes a power supply voltage regulator 402 which battery cells 406, 408, 410 and 412 are coupled to feed power to the device 317. An ON/OFF control switch is coupled to the power supply voltage regulator for turning off or turning on device 317. The aforementioned card detect signal from card detect circuit 396 is received by power supply voltage regulator 402 to trigger supplying power to the unit. The power supply voltage regulator 402 also is connectable to external wall transformer 400 to eliminate battery draining when the user has access to an available external wall outlet. Additionally, power supply voltage regulator 402 is coupled to power coming from an external bus via an IEEE 1394, USB, or other port.

Figure 11:
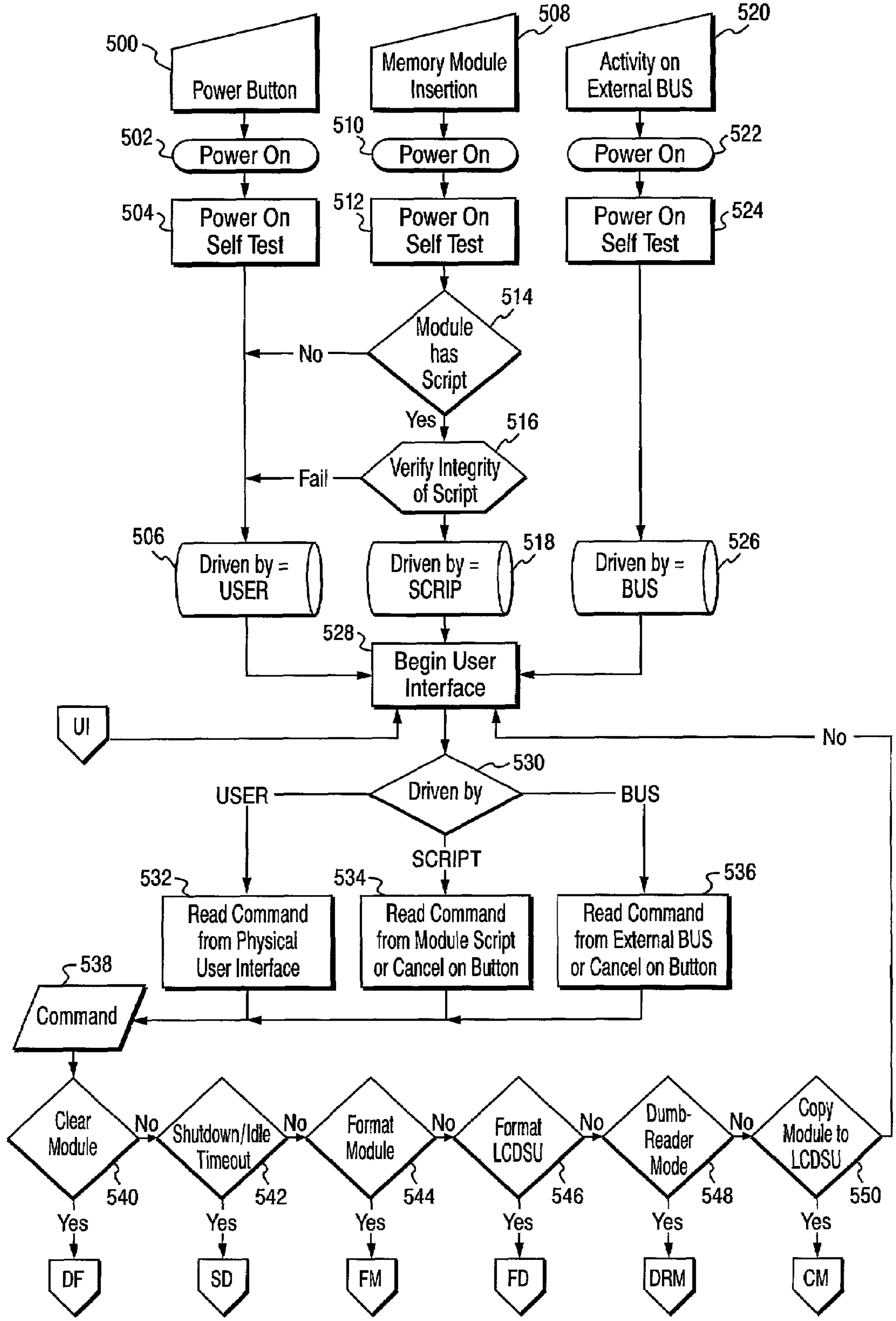
FIGS. 11 through 17 are flowcharts delineating an illustrative sequence of operations performed by processor 320 in controlling the enhanced digital data collector in accordance with an exemplary embodiment of the present invention.

FIG. 11 is a flow diagram delineating the sequence of operations performed under processor 320 control during the operation of the enhanced digital data collector 317. As shown in FIG. 11, in accordance with one mode of initiating operation, a user presses the power button (500) which causes power to be turned on (502). Alternatively, as previously described, the power may be turned on (510) in response to the insertion of a memory module (508). A still further power initiating event is the detection of activity on an external bus (520) such as, for example, on a FireWire™ bus being coupled to the enhanced digital data collector 317 (520,522).

After power is turned on via 502, 510 or 522, power on self-testing operations are performed 504, 512, 524. In power on self-testing, basic diagnostics tests are performed which, as will be appreciated by those skilled in the art, include checking processor 320 memory modules 350, 352, 354, 356, etc., and determining what type of devices are coupled to data collector 317.

If the user depressed the power button (500), then after initialization testing at 504, input processing is driven by the user (506). If a memory module had been inserted (508), after power had been turned on and initialization steps have been performed (510, 512), a check is made to determine whether the memory module has a Script file (514). If the check at 514 determines that there is a Script file, then the integrity of the Script File is verified (516). After verifying the integrity of the Script File, then, as indicated at block 518, the user interface user is driven by the Script file commands. If the check at block 514 indicates that the memory module has no Script file or if the integrity of the Script file could not be verified, then the user interface 528 is instructed that it will be driven by the user (506).

If power is sequenced on via on activity on an external bus (520, 522) after power on, self-test operations are performed (524) the user interface is driven by the external bus. Such activity on the external bus may, for example, cause the data collector 317 to operate in a "dumb" flash memory reader mode.

At block 530 command processing operations are initiated which differ depending upon which of the three above-described branches of FIG. 11 led to initiating command processing. If the check at block 530 by processor 320 reveals that the user interface was initiated via the user pressing the power button, then commands are read from the physical user interface (532). Thus, the processor 320 scans the device keyboard to determine what action to take next. If a memory module had been inserted (508) and the module has a Script file, then a command is read from the Script file and the user is given the option to cancel the command via a "cancel function" implementing keyboard button (534).

If activity was detected on external bus, then commands are read from the external bus or such commands may be canceled via a keyboard button (536). For example, if the external bus activity involves coupling the data collector to a computer, then commands may originate from the host computer (338). An exemplary set of instructions implemented by the external bus related interface could be those of a home audio/video interface (HAVI) which is a FireWire™ related standard. For example, a camcorder could be plugged into the system using HAVI and the camcorder may be controlled via the computer to perform such operations as zoom in or zoom out, etc. Various other dedicated applications may be controlled via such external bus generated commands.

Whether a command is read via 532, 534 or 536, commands are processed at 538. Exemplary commands that are processed are indicated at blocks 540 through 550 in FIG. 11. For example, a check is made at block 540 to determine whether the command is "clear module" command. A clear module command is a command which will trigger the deletion of the entire contents of a memory module.

If the check at block 540 indicates that the command is not a clear module command, then a check is made at block 542 to see whether the command is a "shut down/idle time out" command. The check at block 542 is an automatic power saving feature which, for example, will only permit the unit to be in an idle state for a predetermined period of time before power down sequencing takes place.

If the check at block 542 indicates that the command is not a shut down or idle time out command, then a check is made to determine whether the command is a "format module" command (544). If, for example, a memory module was corrupted, if a format module command is performed this permits the reformatting of the module so that the module may be reused.

If a format module command was not detected, then a check is made at block 546 to determine whether the command is a "format LCDSU" command. The processing for formatting the LCDSU tailors the format of the LCDSU to the host system coupled to the digital data collector. For example, as will be appreciated by those skilled in the art, a PC uses one type of file system and a Mac uses a different type of file system. The various different file systems used with different host computers are not compatible, and the processing indicated at block 546 permits the LCDSU to be formatted to whatever file system is being used. Such processing may lead to translating from one file system to another.

If the check at block at 546 indicates that a format LCDSU command is not being processed, then a check is made to determine whether the command is "dumb reader" mode command (548). In this mode, the data collector acts as a memory module reader to read data from one of the various modules to, for example, a host computer system.

If the command is not a dumb reader mode command, then a check is made to determine whether a command is a command for copying the contents of a module to, for example, the LCDSU. If the check at block 550 indicates that a "copy module" command has not been detected, then the routine branches back to block 528. Additional modes of operation could be included to control operations for renaming files/directories, control of data movement to/from any device and allow for compression of such data.

Figure 12:
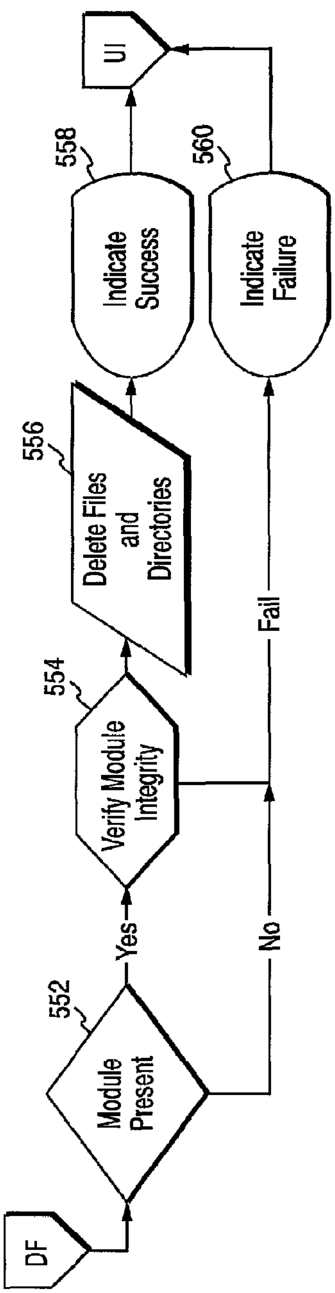

FIG. 12 delineates the sequence of operations involved in clearing a module. If it is determined that a clear module command is to be executed, an initial check is made at block 552 to ensure that a module is present. If a module is present, the integrity of the module is verified (554) before any steps are taken to delete file directories on a module, to make sure the module has not been corrupted. If either a module is not present as indicated by the check at block 552 or if the module integrity is not verified at 554, an indication of failure (560) is coupled to the user via, for example, an LCD display indicating such failure. If the integrity of the module is verified based on the check at 554, module files and directories are deleted (556). Thereafter, an indication of success in clearing the module (550) is conveyed to the user via, for example, an LCD display indication of such and the routine branches back to the user interface entry block 528. The module may thereafter be reused.

Figure 13:
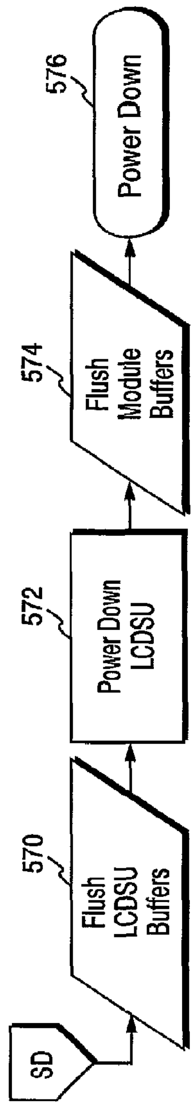

If the check at block 542 indicates that the data collector is to be shut down, then as indicated in FIG. 13, the LCDSU buffers are flushed (block 570) so that the buffers content are saved. Thereafter, the LCDSU is powered down (572). The module buffers are then flushed to, for example, complete any required updates (574) and the unit is powered down (576).

Figure 14:
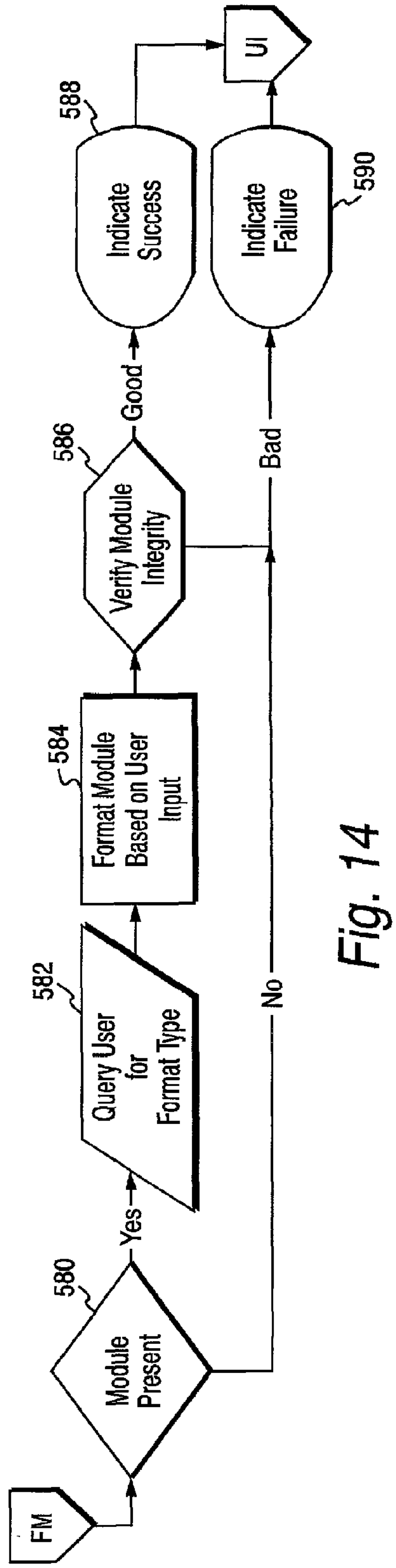

If the check at block 544 indicates that a format module command has been detected then, as shown in FIG. 14, a check is made to determine whether a module is present (580). If the module is present, the user is queried as to the desired format type (582). The user, for example, may be queried as to whether the file allocation table is to be a FAT 12 or FAT 16 format. Thereafter, the module is formatted in the requested format type (584). After the formatting of the module, the integrity of the module is verified (586). If the integrity of the module is verified, then an indication of a successful formatting operation is conveyed to the user (588). If the check at block 580 indicates that a module is not present or the integrity of the reformatted module could not be verified, then an indication of operation failure is conveyed to the user (590). After an indicated message is conveyed to the user the routine branches back to begin user interface processing at block (528).

Figure 15:
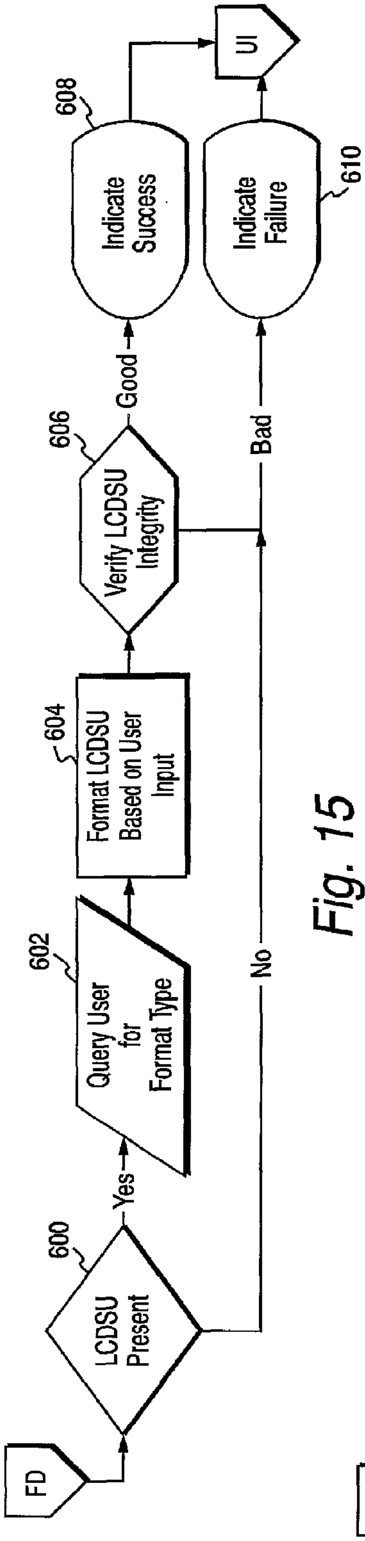

If the check at block 546 indicates that a format LCDSU is to be executed then, as indicated at FIG. 15, block 615, a check is made as to whether or not an LCDSU is present. The user is then queried (602) as to the desired format type for the LCDSU to determine whether, for example, a PC, Mac or other format is desired for the LCDSU. After receiving the user's response, the LCDSU is formatted based on the user's input (604) to reformat the LCDSU for the user's desired format based upon the device to which the digital data collector 317 is connected. After formatting the LCDSU, the LCDSU integrity is verified (606). If the integrity of the LCDSU is verified, then an indication of success is conveyed to the user (608). If the check at block 600 reveals that a LCDSU is not present or if the integrity check at 606 indicates that the LCDSU is bad, an indication of failure (610) is conveyed to the user. After a message is conveyed to the user, the routine branches back to begin the user interface block 528.

In accordance with one exemplary implementation, the LCDSU may be partitioned into multiple formats so one partition could be for NTFS support while a second partition supported Mac, etc. Once attached to a host computer 338, the LCDSU could mount the logical partitions which the host computer 338 supported. Built in functions would allow the user to dynamically change the partition sizes.

Driver software on the attached computer 338 could transparently convert the logical format of the LCDSU into the native format of the computer 338 allowing it to read and write to the LCDSU, which is using a different logical format.

In accordance with an exemplary embodiment, the enhanced digital data collector would support one or more partitions where a partition is not intended to store data files but instead stores streaming data such as DV (digital Video) allowing the device 317 to store digital video/digital audio data from a camcorder or other source. (Internet, CATV, Digital VCR, Etc.) Optionally the data stream could be converted into a compressed format such as MPEG.

In accordance with a further exemplary embodiment, the enhanced digital data collector 317 would have it's own logical format used with an LCDSU which would allow it to emulate the different file formats used with different computer 338 operating systems. For example, NTFS, FAT12, FAT16, Linux HDD format, Mac HDD format, could be emulated by using a processor 320 to interpret the host system request and translate the request into the format used on the LCDSU. A user interface on the device could be used to manual select which host system the device is connected to. It is also contemplated that the device 317 may monitor data from the host to automatically determine which type of host computer 338 is attached.

Figure 17:
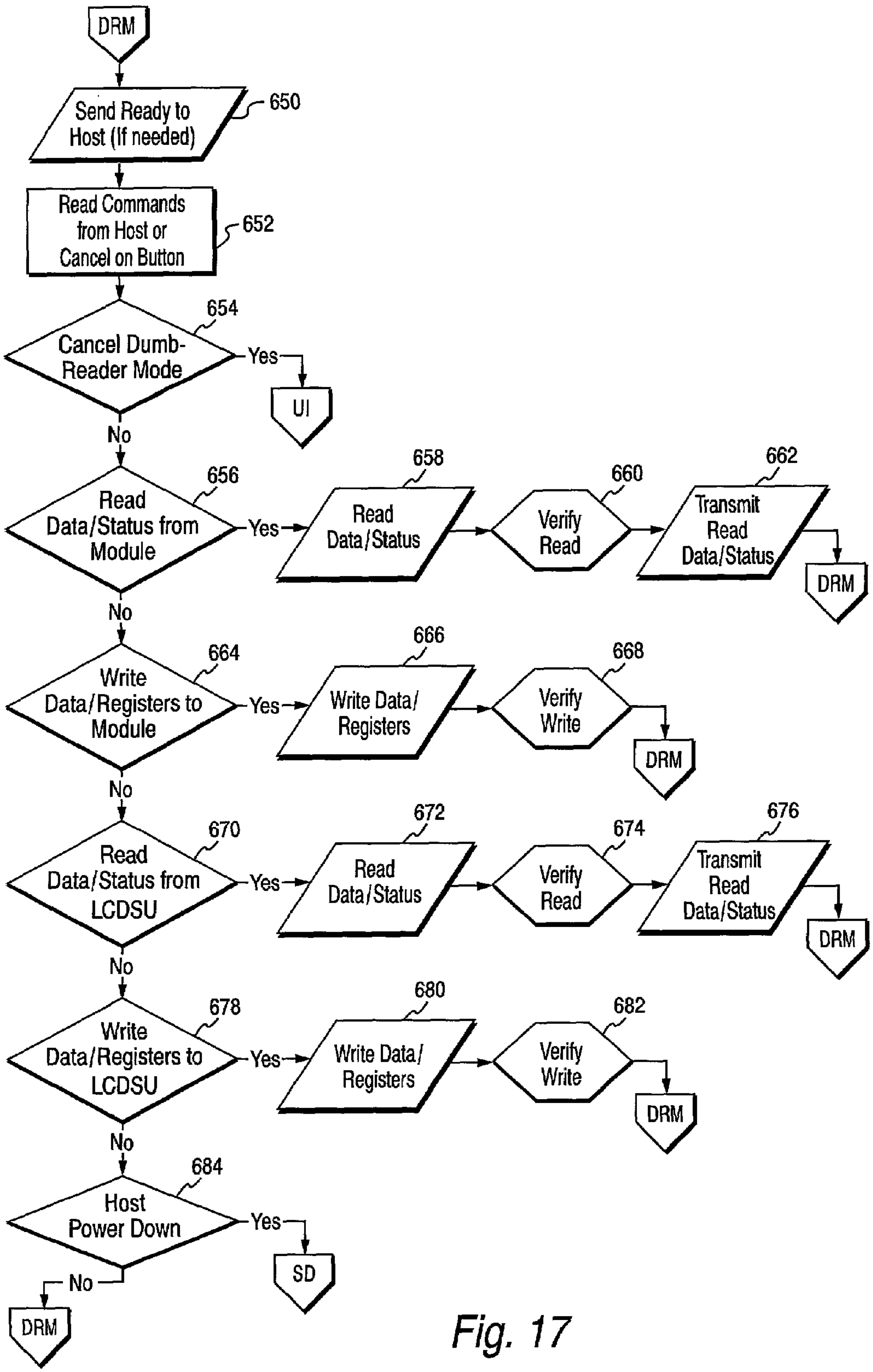

If the check at block 548 indicates that a "dumb reader" command is present, then processing occurs as is shown in FIG. 17. In the dumb reader mode, an external cable is plugged into the enhanced digital data collector to enable the digital data collector to act as a reader, for example, for a host computer. Initially a ready indication is sent to the host (650) if such a protocol communication is needed in order to communicate with the host computer, such as may be the case with, for example, a USB port. Upon receipt of the ready indication, host computer commands are read (652) to receive commands from the host for performing the necessary operational commands for reading the desired module. Alternatively, as indicated at block 652, the user has the option of canceling the dumb reader mode. A check is then made at block 654 to determine whether the user has canceled the dumb reader mode and, if so, the routine branches back to the begin user interface 528.

If the user has not canceled the dumb reader mode, a check is made at block 656 to determine whether a read data or status command from the module is to be executed. If the check at block 656 indicates that such a read command is present, then the data or status from the module is read (658). The read operation is verified (660) and the read data/status information is transmitted to the host. (662). The user reading the read/data status information from the module would be able to read through the module FAT and review the contents of the module.

If the check at block 656 indicates that a read data/status command is not present, then a check at block 664 is made to determine whether a write data/registers to module is be executed. If so, then data is written to the module (666) after which the write operation is verified (668) and the routine branches back to block 650.

If the check at block 664 indicates that a write data/registers command is not present, then a check is made (670) to determine whether a read data/status from the LCDSU is present. If the check at block 670 indicates that such a read data/status command is present, then data/status information is read from LCDSU (672). Thereafter, the read operation is verified (674) and the read data/status information is transmitted to the host (672) and the routine branches back to block 650.

If the check at block 670 indicates that a read data/status command is not present, then a check is made (678) to determine whether a write data/registers to the LCDSU command is present. If such command is present, then the data is written to the LCDSU or its registers (680). Thereafter, the write operation is verified (682) and the routine branches back to block 650.

If the check at block 678 indicates that a write data/register command was not present, then a check is then made at block 684 to determine whether a host power-down command is to be executed. If so, the routine branches to the FIG. 13 shut down routine. If not, the routine branches to block 650.

Figure 16:
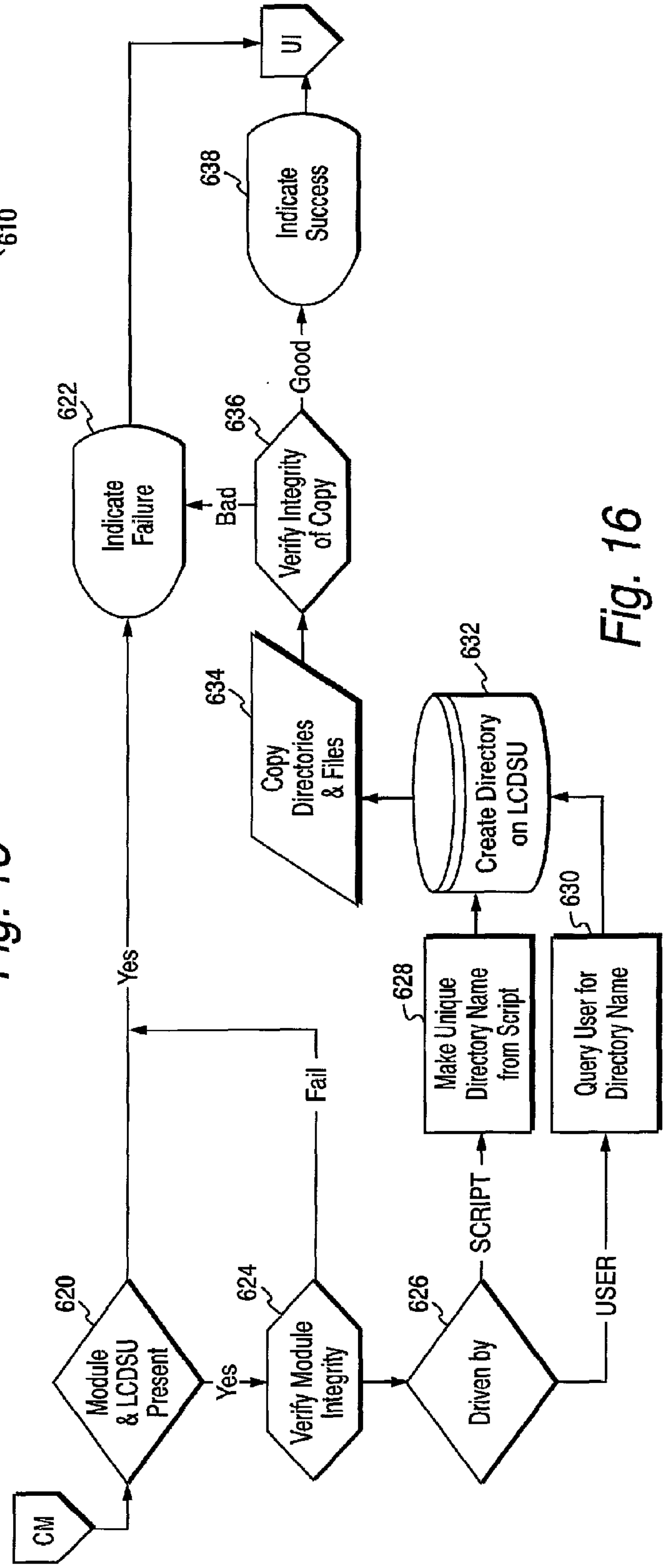

If the check at block 550 indicates that a module is to be copied, then as indicated in FIG. 16 block 620, a check is made to ensure that both the module and the LCDSU are present. If both the module and the LCDSU are present, the module integrity is then verified (624). If the module integrity is verified, then a check is made at 626 to determine whether the module is driven by the user or by script commands. If it is driven by the script file, then a unique directory name is utilized from the script file (628). If the check at block 626 indicates that the directory name is driven from user input, then the user is queried for the directory name (630). After the directory name has been generated at either blocks 628 or 630, the directory is created on the LCDSU (632). The directory and files are then copied to, for example, a hard disk drive from the modules or from the modules to the hard disk drive (634).

After the directory and files are copied, the integrity of the copy is verified (636). If the integrity is verified, a corresponding message is conveyed to the user (638). The module may then be reused. If the check at block 620 indicates that a module and LCDSU are not present or if the check at block 624 indicates that the module integrity cannot be verified, or if the integrity of the copy at 636 cannot be verified, then a failure indication is conveyed to the user (622). After a message from 622 or 638 is conveyed to the user, the routine branches to the beginning user interface 628.

It will be understood by those skilled in the art that the foregoing description is in the terms of a preferred embodiment of the present invention, wherein various changes and modifications may be made without departing from the spirit and scope of the invention as set forth in the appended claims.

What is claimed is:

1. A portable, hand-held, digital picture image data transfer and repository device for displaying a user's digital photographs, said repository device being embodied in a housing operable to receive digital picture image data and being connectable to a user's notebook or desktop computer and being of a size which can be held in a user's palm, said repository device comprising:

a housing of a size to be held in the palm of a user's hand and including at least one port operable to receive digital camera picture image data including a copy of the contents of a memory of a digital camera containing picture image data previously captured by a digital camera, and at least one port operable to couple said portable repository device to a user's computer and to receive digital picture image data from said user's computer;

a battery embodied in said housing for supplying electrical power;

a mass storage device embodied in said housing having at least one gigabyte of storage operatively coupled to receive and store said copy of the contents of a memory of a digital camera containing picture image data previously captured by a digital camera, said mass storage device being accessible for receiving picture image data resident in a user's computer;

data processing circuitry embodied in said housing for controlling the transfer of data to and from said mass storage device, said processing circuitry being operable to determine whether a request has been made to transfer picture image data from a user's computer to said mass storage device;

a display device embodied in said housing for displaying to a user a plurality of graphical images depicting picture image data;

at least one user interface key embodied in said housing including a copy key for initiating the copying of the contents of a memory of a digital camera containing picture camera data previously captured by said digital camera from said memory of said digital camera to said mass storage device; and an input/output interface, coupled to said mass storage device, for use in transferring image data between said mass storage device aud said user's computer, said input/output interface being compatible with an interface of said user's computer.

2. A data transfer and repository device according to claim 1, wherein said mass storage device is operable to store digital audio data and picture image data.

3. A data transfer and repository device according to claim 1, wherein said repository device is operable with a flash memory reader, a mass storage device and a battery, at least one of which is not embodied within said housing.

4. A data transfer and repository device according to claim 1, wherein said repository device is operatively connectable to a camera via said at least one port operable to receive digital camera picture image data.

5. A data transfer and repository device according to claim 1, wherein said plurality of graphical images are JPEG images.

6. A data transfer and repository device according to claim 1, wherein said processing circuitry is operatively connectable to an external video device.

7. A data transfer and repository device according to claim 1, wherein said digital picture image data includes moving picture image data and said mass storage device is operable to store moving image picture data and further wherein said display is operable to display moving image picture data.

8. A data transfer and repository device according to claim 1, wherein said at least one port operable to couple is connectable to a further electronic device.

9. A data transfer and repository device according to claim 8, wherein said further electronic device is a camcorder.

10. A data transfer and repository device according to claim 8, wherein said further electronic device is a digital camera.

11. A data transfer and repository device according to claim 1, wherein said at least one port operable to receive digital camera picture image data and said at least one port operable to couple said portable repository device to a user's computer are embodied in the same port.

12. A data transfer and repository device according to claim 1, wherein said data processing circuitry includes processing circuitry for reformatting a digital memory module into a state where it can be reused.

13. A data transfer and repository device in accordance with claim 1, where said at least one port operable to couple is operatively coupled to said mass storage device for transferring picture image data to a user's computer.

14. A data transfer and repository device in accordance with claim 1, wherein said at least one user interface key is operable for initiating predetermined operations relating to a flash memory module.

15. A data transfer and repository device in accordance with claim 14, wherein said at least one user interface key is part of a keyboard and wherein said data processing circuitry is responsive to user initiation of said at least one key to control the transfer of data from said flash memory module to said mass storage device.

16. A data transfer and repository device in accordance with claim 1, wherein said repository device is operable to display data indicative of at least part of the contents of a flash memory module.

17. A data transfer and repository device in accordance with claim 1, wherein said at least one port operable to receive digital camera image data is a memory port in said housing sized to receive a flash memory module, said data processing circuitry being operable to selectively transfer the contents of said flash memory module to said mass storage device.

18. A data transfer and repository device in accordance with claim 1, wherein said mass storage device is a hard drive.

19. A data transfer and repository device according to claim 1, wherein said data processing circuitry includes processing circuitry for formatting a file system of said mass storage unit so that it is compatible with a host device file system.

20. A data transfer and repository device according to claim 1, further including clocking circuitry for a generating time related signal, said repository device for storing time related data associated with picture image data.

21. A data transfer and repository device according to claim 20, wherein said display is operable to display time related data associated with picture image data.

22. A data transfer and repository device according to claim 1, including a port operatively connectable to a home video device.

23. For use in transferring data between a digital camera flash memory module and a user's computer, a portable, hand-held, digital data transfer and repository device embodied in a housing operatively connectable to a user's notebook or desktop computer and which is of a size which can be held in a user's palm, said repository device comprising:

a hand-held housing of a size to be held in the palm of a user's hand and including a plurality of ports, at least one of said plurality of ports for receiving digital camera memory data including a copy of the contents of a memory of a digital camera containing picture image data previously captured by a digital camera, and at least one of said ports for coupling said portable repository device to a user's computer, a hard disk drive having a storage capacity of at least one gigabyte contained within said hand-held housing and operatively coupled to receive and store digital data from a digital camera memory said copy of the contents of a memory of a digital camera containing picture image data previously captured by a digital camera, said hard disk drive storing JPEG files and audio data and being accessible for data transfer between said portable repository device and a user's computer;

processing circuitry contained within said hand-held housing for controlling the transfer of data stored in a digital flash memory module to said hard disk drive, an LCD display device embodied in said hand-held housing for displaying JPEG graphical images, at least one user interface key embodied in said housing including a copy key for initiating the copying of the contents of a memory of a digital camera containing picture image data previously captured by said digital camera from said memory of said digital camera to said mass storage device; and an input/output interface, coupled to said hard disk drive, for use in transferring data between said hard disk drive and said user's computer, said input/output interface being compatible with an interface of said user's computer.

24. A data transfer and repository device according to claim 23, wherein said repository device is operable with a flash memory reader, a mass storage device and a battery, at least one of which is not embodied within said housing.

25. A data transfer and repository device according to claim 23, wherein said repository device is operatively connectable to a camera via one of said plurality of ports.

26. A data transfer and repository device according to claim 23, wherein said at least one of said ports being operable for receiving digital camera picture image data and at least one of said ports being operable for coupling said portable repository device to a user's computer is embodied in the same port.

27. A data transfer and repository device according to claim 23, wherein said data processing circuitry includes processing circuitry for reformatting a digital memory module inserted into one of said plurality of ports into a state where it can be reused.

28. A data transfer and repository device in accordance with claim 23, wherein:

at least one user interface key is operable for initiating predetermined operations relating to a flash memory module.

29. A data transfer and repository device in accordance with claim 23, wherein said hard disk drive is operable to store moving picture image data and wherein said display is operable to display moving picture image data.

30. A data transfer and repository device in accordance with claim 23, wherein said at least one of said ports being operable for receiving digital camera image data is a memory port in said housing sized to receive a flash memory module, said data processing circuitry being operable to selectively transfer the contents of said flash memory module to said hard drive.

31. A data transfer and repository device according to claim 23, wherein said data processing circuitry includes processing circuitry for formatting a file system of said hard drive unit so that it is compatible with a host device file system.

32. A method of operating a portable, hand-held digital camera picture image data transfer and repository device, said data transfer and repository device including within a hand-held housing which can be comfortably held in a user's palm: a port for coupling said portable repository device to a user's computer, a hard disk drive having a storage capacity of at least one gigabyte for storing picture image data, an input/output interface coupled to said hard disk drive for use in transferring image data between said hard disk drive and said user's computer, at least one user interface key including a copy key for initiating the copying of the contents of a memory of a digital camera containing picture image data previously captured by said digital camera from said memory of said digital camera to said hard disk drive device and an LCD display, said method comprising the steps of:

receiving picture image data previously captured from a digital camera and stored in a digital camera memory;

storing said picture image data in said hard drive embodied within said repository device in response to a user actuating said copy key embodied in said hand-held housing of said digital camera picture image data transfer and repository device;

determining whether a request has been made to transfer picture image data from a user's computer to said hard drive;

transferring picture image data from a user's computer to said hard disk drive within said repository device in response to said request;

displaying picture image data on an LCD display embodied within said repository device; and controlling operations involving picture image data in response to a user actuating keys embodied in said hand-held housing.

33. A method according to claim 32, wherein the step of displaying includes:

displaying on said LCD of said portable device data indicative of at least part of the contents of a digital camera flash memory module.

34. A method according to claim 32, further including the step of receiving a command for performing an operation with said picture from image data.

35. A method according to claim 34, wherein the step of receiving a command includes the step of reading the command from a user interface.

36. A method according to claim 34, wherein the step of receiving a command includes the step of reading the command from an external bus coupled to a further electronic device.

37. A method according to claim 32, wherein said repository device is coupled to a further electronic device via an external bus and further including the steps of detecting activity on said external bus and powering up the device in response to external bus activity.

38. A method according to claim 32, further including the step of reformatting a digital memory module inserted into a memory port to place said digital memory module into a state where it can be reused.

39. A method according to claim 32, wherein said picture image data includes moving picture image data and further including the step of displaying moving picture image data on said LCD display embodied within said display device.

* * * * *